United States Patent [19]

Yano

[11] Patent Number: 5,448,099
[45] Date of Patent: Sep. 5, 1995

[54] PIN-TYPE LIGHT RECEIVING DEVICE, MANUFACTURE OF THE PIN-TYPE LIGHT RECEIVING DEVICE AND OPTOELECTRONIC INTEGRATED CIRCUIT

[75] Inventor: Hiroshi Yano, Yokohama, Japan

[73] Assignee: Sumitomo Electric Industries, Ltd., Japan

[21] Appl. No.: 203,921

[22] Filed: Mar. 1, 1994

[30] Foreign Application Priority Data

Mar. 4, 1993 [JP] Japan .................. 5-044082

[51] Int. Cl.$^6$ ...................... H01L 27/14; H01L 31/00
[52] U.S. Cl. .................................. 257/452; 257/458; 257/459; 257/464; 257/466
[58] Field of Search ............... 257/458, 452, 184, 618, 257/623, 656, 459, 464, 466

[56] References Cited

U.S. PATENT DOCUMENTS 4,885,622 12/1989 Uchiyama et al. .................. 257/458
5,051,372 9/1991 Sasaki ................................. 257/623

OTHER PUBLICATIONS

"1.3 μm Wavelength Optical Receiver Front-End OEIC," Inst. Phys. Conf. Ser. No. 96: Chapter 8, by Dawe et al., presented at the Int. Symp. GaAs and Related Compounds, Atlanta, Ga, 1988.
"An InP/InGaAs p-i-n/HBT Monolithic Transimpedance Photoreceiver," IEEE Photonics Technology Letters, vol. 2, No. 7, Jul., 1990, by Chandrasekhar et al.
"Monolithic pin-HEMT Receiver With Internal Equaliser for Long-Wavelength Fibre Optic Communications," Electronic Letters, vol. 26, No. 5, Mar. 1, 1990, by H. Yano et al.

Primary Examiner—Jerome Jackson
Assistant Examiner—Donald L. Monin, Jr.
Attorney, Agent, or Firm—Beveridge, DeGrandi, Weilacher & Young

[57] ABSTRACT

In a optoelectronic integrated circuit, a pin-type light receiving device and an electronic circuit device are electrically connected to each other and monolithically integrated on a semiconductor substrate. In the pin-type light receiving device, an n-type semiconductor layer, an i-type semiconductor layer, and a p-type semiconductor layer are sequentially formed on the semiconductor substrate and sequentially formed into mesa shapes. The first mesa is constituted by the p-type semiconductor layer, and the second mesa is constituted by the i-type semiconductor layer. The boundary surface between the first and second mesas is formed to match the junction surface between the p-type semiconductor layer and the i-type semiconductor layer. The diameter of the first mesa is formed smaller than that of the second mesa. With this structure, a depletion layer extending from the p-type semiconductor layer upon application of a reverse bias voltage stays within the i-type semiconductor layer and does not reach the surfaces of the first and second mesas to be exposed. For this reason, a dark current flowing in accordance with the interface state between the side surface of the mesa and an insulating layer for protecting the surface of the mesa is reduced. Therefore, a noise signal input in the electronic circuit device is reduced to improve the receiving sensitivity.

42 Claims, 11 Drawing Sheets

PIN-TYPE LIGHT RECEIVING DEVICE, MANUFACTURE OF THE PIN-TYPE LIGHT RECEIVING DEVICE AND OPTOELECTRONIC INTEGRATED CIRCUIT

BACKGROUND OF THE INVENTION

1. Field of the Invention

The present invention relates to a pin-type light receiving device used in optical fiber communication or the like, and an optoelectronic integrated circuit in which the pin-type light receiving device and an electronic circuit device are monolithically integrated.

2. Related Background Art

In optical fiber communication or the like, a pin-PD (Photo Diode) is generally used as a light receiving device, especially a light receiving device monolithically integrated together with an electronic circuit device such as an FET (Field Effect Transistor) in a optoelectronic integrated circuit. This pin-PD is mainly formed into a mesa shape from a viewpoint of easy integration or isolation between devices.

In a conventional pin-PD, for example, an n-type semiconductor layer, an i-type semiconductor layer, and a p-type semiconductor layer are sequentially formed on a semiconductor substrate consisting of InP having semi-isulation properties, each semiconductor layer is formed into a mesa shape, and the surface thereof is protected by an insulating layer.

Prior arts about such a mesa type pin-PD are described in detail in, e.g., "Inst. Phys. Conf., ser. no. 96, chap. 8, Int. Symp. GaAs and Related Compounds, pp. 571–574, 1988", "IEEE Photon. Technol. Lett., vol. 2, no. 7, pp. 505–506, 1990", and "Electron. Lett., vol. 26, no. 5, pp. 305–307, 1990".

In the above conventional mesa type pin-PD, upon application of a reverse bias voltage, a depletion layer extending from the p-type semiconductor layer is exposed to the surface of the mesa mainly constituted by the i-type semiconductor layer. More specifically, the depletion layer reaches the interface between the side surface of the i-type semiconductor layer and the insulating layer for protecting the surface of the i-type semiconductor layer. For this reason, in accordance with the interface state, a dark current is generated to flow along the surface of the mesa from the p-type semiconductor layer to the i-type semiconductor layer. Therefore, a large amount of dark current is generated.

In addition, in such an optoelectronic integrated circuit in which a pin-PD and an electronic circuit device are integrated, when the dark current is generated, noise is increased to degrade the receiving sensitivity.

SUMMARY OF THE INVENTION

The present invention has been made in consideration of the above problems and has as its object to provide a pin-type light receiving device which reduces a dark current to improve device characteristics, a manufacture of the pin-type light receiving device and an optoelectronic integrated circuit in which the pin-type light receiving device and an electronic circuit device are integrated to improve the receiving sensitivity.

In order to achieve the above object, according to the present invention, there is provided a pin-type light receiving device comprising a semiconductor substrate, an n-type semiconductor layer formed on the semiconductor substrate and doped with an n-type impurity, an n-type ohmic electrode layer formed on the n-type semiconductor layer and having an ohmic-contact property, a mesa portion constructed by an i-type semiconductor layer not intentionally doped with an impurity and a p-type semiconductor layer doped with a p-type impurity formed sequentially on the n-type semiconductor layer and formed into a mesa shape, and a p-type ohmic electrode layer formed on the p-type semiconductor layer and having an ohmic-contact property, wherein a circumferential border portion of the p-type semiconductor layer of the mesa portion is removed to a depth matched substantially a junction surface between the p-type semiconductor layer and the i-type semiconductor layer. The depth matched substantially the junction surface is set to restrain a dark current flowing along the surface of the mesa portion from the p-type semiconductor layer to the i-type semiconductor layer.

The pin-type light receiving device may further comprise an etching stop semiconductor layer formed in contact with the junction surface and having an etching selectivity different from that of the p-type semiconductor layer. The p-type semiconductor layer preferably consists of GaInAs or GaInAsP, and the etching-stop semiconductor layer preferably consists of InP. The p-type semiconductor layer preferably consists of GaInAs or GaInAsP, and the etching stop semiconductor layer preferably consists of GaInAsP having an energy band gap wider than that of GaInAs or GaInAsP constituting the p-type semiconductor layer.

The etching stop semiconductor layer may further have an etching selectivity different from that of the i-type semiconductor layer. The i-type semiconductor layer preferably consists of GaInAs or GaInAsP, and the etching stop semiconductor layer preferably consists of InP. The i-type semiconductor layer preferably consists of GaInAs or GaInAsP, and the etching stop semiconductor layer preferably consists of GaInAsP having an energy band gap wider than that of GaInAs or GaInAsP constituting the i-type semiconductor layer.

The i-type semiconductor layer may consist of GaInAs.

In order to achieve the above object, according to the present invention, there is provided a manufacture of a pin-type light receiving device comprising a first step forming sequentially an n-type semiconductor layer doped with an n-type impurity, an i-type semiconductor layer not intentionally doped with an impurity, an etching-stop semiconductor layer and p-type semiconductor layer doped with a p-type impurity on a semiconductor substrate, a second step removing a circumferential border portion of the p-type semiconductor layer to a depth exposed the etching-stop semiconductor layer to form a first mesa constituted by the p-type semiconductor layer, a third step removing sequentially a circumferential border portion of both the etching-stop semiconductor layer and the i-type semiconductor layer to form a second mesa constituted by the etching-stop semiconductor layer and the i-type semiconductor layer arranged the first mesa on a center portion of the etching stop semiconductor layer and a forth step forming an n-type ohmic electrode layer having an ohmic contact property on the n-type semiconductor layer and forming a p-type ohmic electrode layer having an ohmic contact property on the p-type semiconductor layer.

In order to achieve the above object, according to the present invention, there is provided an optoelectronic integrated circuit comprising a pin-type light receiving device according to the present invention, and an electronic circuit device electrically connected to the pin-type light receiving device and monolithically formed on a semiconductor substrate, wherein the pin-type light receiving device and the electronic circuit device are integrated. The electronic circuit device may be a field effect transistor. The electronic circuit device may be a bipolar transistor.

In the pin-type light receiving device, the circumferential border portion of the p-type semiconductor layer of the mesa portion is removed to the depth matched the junction surface between the p-type semiconductor layer and the i-type semiconductor layer, and the first mesa constituted by the p-type semiconductor layer and the second mesa constituted by the i-type semiconductor layer are formed. A depletion layer extending upon application of a reverse bias voltage substantially extends through the i-type semiconductor layer in a direction of thickness from the p-type semiconductor layer to the n-type semiconductor layer.

Since the diameter of the first mesa is smaller than that of the second mesa, the depletion layer extending from the p-type semiconductor layer hardly extends beyond the diameter of the first mesa in the radial direction. For this reason, the depletion layer does not reach the surface of the second mesa to be exposed. In addition, since the boundary surface between the first and second mesas matches the junction surface between the p-type semiconductor layer and the i-type semiconductor layer and a carrier concentration of the p-type semiconductor layer is much higher than that of the i-type semiconductor layer, the depletion layer extending from the p-type semiconductor layer hardly extends within the first mesa in the direction of thickness. For this reason, the depletion layer does not reach the surface of the first mesa to be exposed.

Therefore, the depletion layer does not reach the surfaces of the first and second mesas to be exposed. That is, the depletion layer does not reach the interface between the side surface of the i-type semiconductor layer and the insulating layer for protecting the surface of the i-type semiconductor layer. As a result, the dark current flowing along the surface of the mesa from the p-type semiconductor layer to the i-type semiconductor layer in accordance with the interface state is reduced.

When the etching-stop semiconductor layer is arranged in contact with the junction surface between the p-type semiconductor layer and the i-type semiconductor layer, a predetermined etching process for the p-type semiconductor layer on the etching stop semiconductor layer is not continuously performed up to the i-type semiconductor layer under the etching stop semiconductor layer. This is because the etching stop semiconductor layer has an etching selectivity different from that of the p-type semiconductor layer. For this reason, when the predetermined etching process for the p-type semiconductor layer is performed for the etching stop semiconductor layer, the etching rate is suppressed or substantially becomes zero. Therefore, the boundary surface between the first and second mesas is set with high reproducibility to almost match the junction surface between the p-type semiconductor layer and the i-type semiconductor layer.

At the same time, when the etching stop semiconductor layer included in the i-type semiconductor layer is arranged in contact with the junction surface between the p-type semiconductor layer and the i-type semiconductor layer, a predetermined etching process for the p-type semiconductor layer on the etching stop semiconductor layer is not continuously performed for the i-type semiconductor layer under the etching stop semiconductor layer. This is because the etching stop semiconductor layer has an etching selectivity different from that of the i-type semiconductor layer and the p-type semiconductor layer. For this reason, the predetermined etching process for the p-type semiconductor layer is performed for the etching stop semiconductor layer, the etching rate is suppressed or substantially becomes zero. Therefore, the boundary surface between the first and second mesas is set with high reproducibility to almost match the junction surface between the p-type semiconductor layer and the i-type semiconductor layer.

Further, in the optoelectronic integrated circuit of the present invention, the pin-type light receiving device according to the present invention and an electronic circuit device are monolithically integrated. In the pin-type light receiving device, the dark current is reduced. In the electronic circuit device, the noise input is reduced accordingly to improve the receiving sensitivity.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DESCRIPTION OF THE PREFERRED EMBODIMENTS

Figure 1:
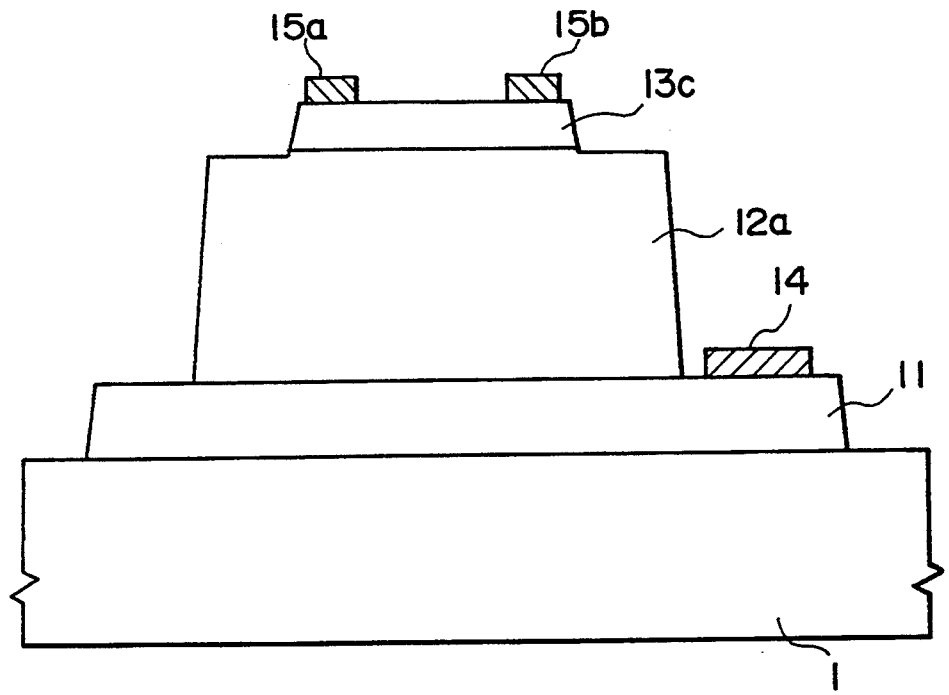
FIG. 1 is a sectional view showing the structure of the first embodiment of a pin-type light receiving device according to the present invention.

The structures and functions of the embodiments according to the present invention will be described below with reference to FIGS. 1 to 26. In a description of the drawings, the same reference numerals denote the same devices, and a detailed description thereof will be omitted. The sizes in the drawings do not necessarily accord with those in the description.

FIG. 1 is a sectional view showing the structure of the first embodiment of a pin-type light receiving device according to the present invention. In this pin-type light receiving device, an n-PD layer 11, an i-PD layer 12a, and a p-PD layer 13c are sequentially formed on a semiconductor substrate 1. The p-PD layer 13c, the i-PD layer 12a, and the n-PD layer 11 are sequentially formed into mesa shapes to respectively constitute the first mesa, the second mesa, and the third mesa having truncated conical shapes. An n-ohmic electrode layer 14 is formed on the n-PD layer 11 at a predetermined position. P-ohmic electrode layers 15a and 15b are formed on the p-PD layer 13c at predetermined positions. A passivation layer (not shown) is formed on the surface of each mesa.

The semiconductor substrate 1 consists of InP doped with Fe at a predetermined dopant concentration and has semi-isulation properties. The n-PD layer 11 consists of InP doped with Si at a dopant concentration of about $2 \times 10^{18}$ cm$^{-3}$ and has a thickness of about 300 to 500 nm and the n conductivity type. The i-PD layer 12a consists of GaInAs or GaInAsP not intentionally doped with a dopant (at a dopant concentration of about $1 \times 10^{15}$ to $2 \times 10^{15}$ cm$^{-3}$) and has a thickness of about 2.0 to 2.5 $\mu$m and a high resistivity. The p-PD layer 13c consists of GaInAs or GaInAsP doped with Zn at a dopant concentration of about $1 \times 10^{19}$ cm$^{-3}$ and has a thickness of about 100 nm and the p conductivity type.

The first mesa mainly constituted by the p-PD layer 13c has a diameter of about 100 $\mu$m. The second mesa mainly constituted by the i-PD layer 12a has a diameter of about 120 $\mu$m. The third mesa mainly constituted by the n-PD layer 11 has a diameter of about 140 to 150 $\mu$m. The n-ohmic electrode layer 14 consists of AuGe/Ni and has a good ohmic-contact property with respect to the n-PD layer 11. The p-ohmic electrode layers 15a and 15b consist of Ti/Pt/Au and have a good ohmic-contact property with respect to the p-PD layer 13c. The passivation layer (not shown) consists of SiN and has isulation properties.

The diameter of the first mesa is formed smaller than that of the second mesa. The boundary surface between the first and second mesas is formed to match the junction surface between the p-PD layer 13c and the i-PD layer 12a. Because of the problem of precision in the manufacturing process, the boundary surface between the first and second mesas is actually formed to be arranged near the lower side of the junction surface between the p-PD layer 13c and the i-PD layer 12a. For this reason, the first mesa is mainly constituted by the p-PD layer 13c and includes part of the i-PD layer 12a. The second mesa is constituted by the remaining part of the i-PD layer 12a which is not included in the first mesa.

The function of the pin-type light receiving device according to the first embodiment will be described below.

In this pin-type light receiving device, the first mesa mainly constituted by the p-PD layer 13c and the second mesa mainly constituted by the i-PD layer 12a are formed. A depletion layer extending upon application of a reverse bias voltage substantially extends through the i-PD layer 12a in the direction of thickness from the p-PD layer 13c to the n-PD layer 11.

Since the diameter of the first mesa is smaller than that of the second mesa, the depletion layer extending from the p-PD layer 13c does not extend beyond the diameter of the first mesa in the radial direction. For this reason, the depletion layer does not reach the surface of the second mesa to be exposed. Since the boundary surface between the first and second mesas matches the junction surface between the p-PD layer 13c and the i-PD layer 12a and a carrier concentration of the p-PD layer 13c is much higher than that of the i-PD layer 12a, the depletion layer extending from the p-PD layer 13c hardly extends within the first mesa in the direction of thickness. For this reason, the depletion layer does not reach the surface of the first mesa to be exposed.

Therefore, the depletion layer does not reach the surfaces of the first and second mesas to be exposed. That is, the depletion layer does not reach the interface between the side surface of the i-PD layer 12a and the passivation layer (not shown) for protecting the surface of the i-PD layer 12a. As a result, the dark current flowing along the surface of the mesa from the p-PD layer 13c to the i-PD layer 12a in accordance with the interface state is reduced.

Figure 2:
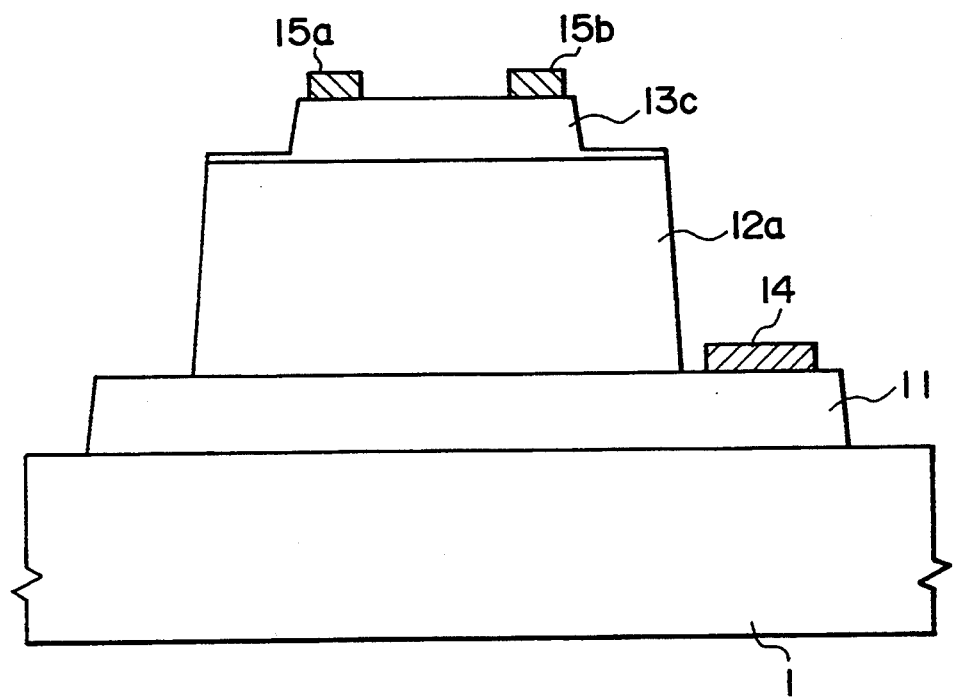
FIG. 2 is a sectional view showing the structure of a modification of the pin-type light receiving device in FIG. 1.

FIG. 2 is a sectional view showing the structure of a modification of the pin-type light receiving device according to the first embodiment. The pin-type light receiving device has almost the same structure as in the first embodiment. Almost as in the first embodiment, the diameter of the first mesa is formed smaller than that of the second mesa. The boundary surface between the first and second mesas is formed to match the junction surface between the p-PD layer 13c and the i-PD layer 12a.

However, this modification is different from the first embodiment in that the boundary surface between the first and second mesas is actually formed to be arranged near the upper side of the junction surface between the p-PD layer 13c and the i-PD layer 12a because of the problem of precision in the manufacturing process. For this reason, the second mesa is mainly constituted by the i-PD layer 12a and includes part of the p-PD layer 13c. The first mesa is constituted by the remaining part of the p-PD layer 13c which is not included in the second mesa.

With the above structure of the pin-type light receiving device, almost the same operation as in the first embodiment can be performed.

Figure 3:
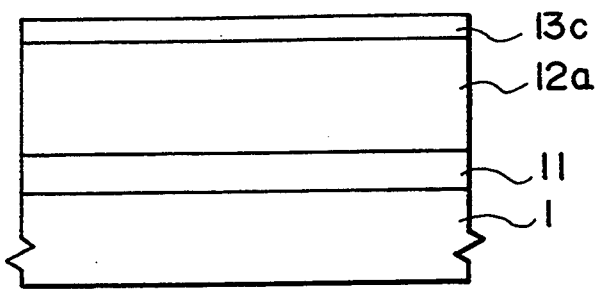
FIGS. 3 to 6 are sectional views showing steps in the manufacture of the pin-type light receiving device in FIG. 1.
Figure 4:
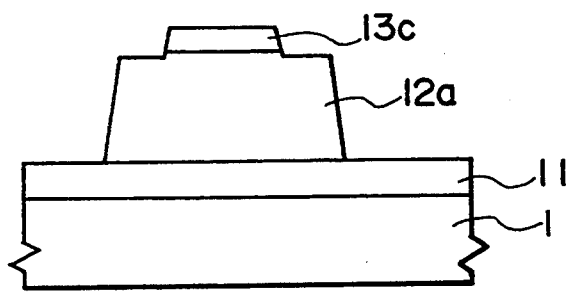

Steps in the manufacture of the first embodiment of the pin-type light receiving device will be described below. FIGS. 3 and 4 are sectional views showing the steps in the manufacture of the first embodiment of the pin-type light receiving device.

By conventional OMVPE (Organometallic Vapor Phase Epitaxy) method, the n-PD layer 11, the i-PD layer 12a, and the p-PD layer 13c are sequentially formed on the semiconductor substrate 1 (FIG. 3).

By conventional photolithography technique, the first mask pattern having a predetermined circular shape is formed on the p-PD layer 13c. The p-PD layer 13c is formed into a mesa shape by conventional wet etching method using a phosphoric acid ($H_3PO_4$) etching solution to form the first mesa. In this case, the etching rate for the p-PD layer 13c is measured beforehand. By measuring the etching time on the basis of this etching rate, the etching depth is controlled to be matched to the thickness of the p-PD layer 13c. By conventional photolithography technique, the second mask pattern having a predetermined circular shape is formed on the p-PD layer 13c and the i-PD layer 12a. The i-PD layer 12a is formed into a mesa shape by conventional wet etching using a phosphoric acid etching solution to form the second mesa. In this case, the diameter of the second mask pattern is larger than that of the first mask pattern. Since the etching selectivity of the i-PD layer 12a is different from that of the n-PD layer 11, when the etching depth reaches the surface of the n-PD layer 11, the etching for the i-PD layer 12a is stopped (FIG. 4).

Figure 5:
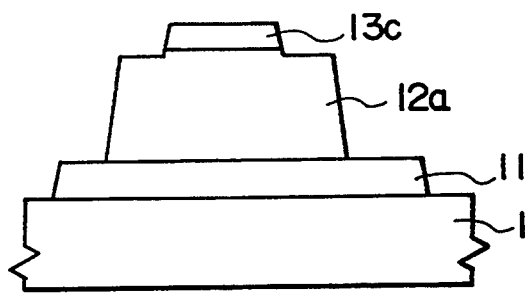

By conventional photolithography technique, the third mask pattern having a predetermined circular shape is formed on the n-PD layer 11. The n-PD layer 11 is formed into a mesa shape by conventional wet etching using a hydrochloric acid (HCl) etching solution to form the third mesa (FIG. 5).

Figure 6:
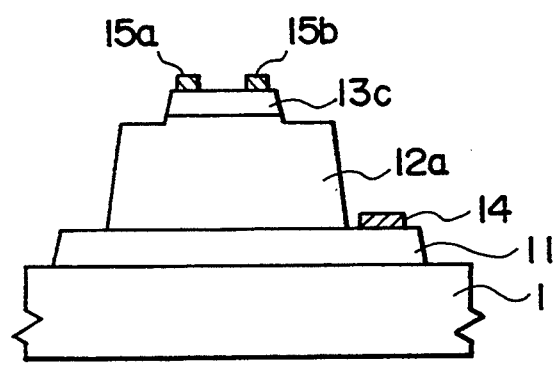

Subsequently, by conventional plasma CVD (Chemical Vapor Deposition) method, a passivation layer (not shown) is deposited on the n-PD layer 11, the i-PD layer 12a, and the p-PD layer 13c. By conventional RIE (Reactive Ion Etching) method, the passivation layer on the n-PD layer 11 and the p-PD layer 13c is removed at predetermined positions to form openings for forming electrodes. By conventional vacuum deposition method, the n-ohmic electrode layer 14 is deposited in the opening on the n-PD layer 11, and the p-ohmic electrode layers 15a and 15b are deposited in the openings on the p-PD layer 13c (FIG. 6).

Figure 7:
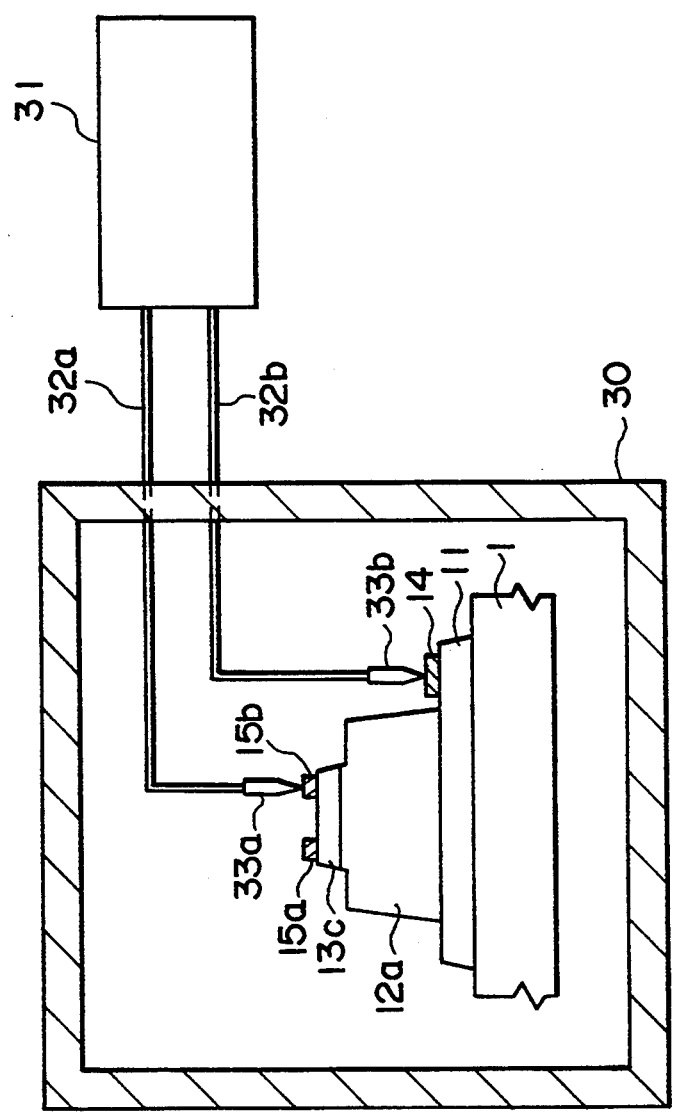
FIG. 7 is a schematic view showing the arrangement of a measurement system for measuring a dark current in the pin-type light receiving device.

An experiment about the pin-type light receiving device of the first embodiment will be described below. FIG. 7 is a schematic view showing the arrangement of the measurement system for measuring a dark current in the pin-type light receiving device.

A dark box 30 and an instrument 31 were arranged in the measurement system. A pin-type light receiving device was placed in the dark box 30 as a target object for the dark current measurement. A coaxial cable 32a was connected to one terminal of the instrument 31, and a coaxial cable 32b was connected to the other terminal. A probe 33a connected to the distal end of the coaxial cable 32a was brought into contact with the p-ohmic electrode layer of the pin-type light receiving device. A probe 33b connected to the distal end of the coaxial cable 32b was brought into contact with the n-ohmic electrode layer of the pin-type light receiving device.

As the dark box 30, a box covered with a cover having a black inner surface and shielding the external light was used. As the instrument 31, a semiconductor parameter analyzer (4145B available from YHP) was used. As an experiment condition, the environment temperature was set to be about 300 K.

Figure 8:
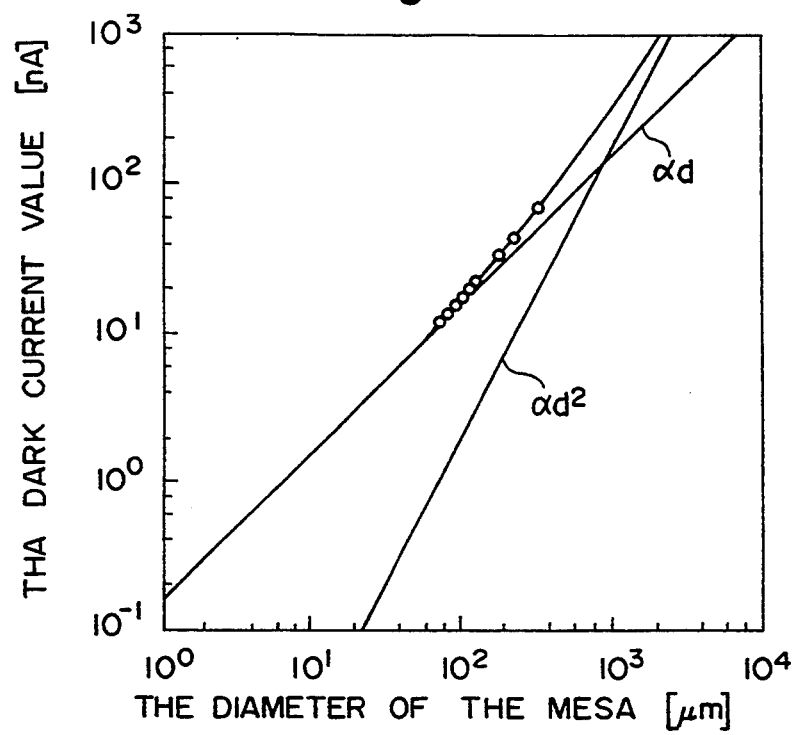
FIG. 8 is a graph showing the relationship between the diameter of the mesa and the dark current in a general pin-type light receiving device.

FIG. 8 is a graph showing the relationship between the diameter of the mesa and the dark current value in a general pin-type light receiving device. The diameter of the mesa constituted by a p-type semiconductor layer and an i-type semiconductor layer is plotted in logarithm along the abscissa. The value of the generated dark current is plotted in logarithm along the ordinate.

The measurement result of a verification experiment is shown in FIG. 8. The experiment was performed by measuring the dark current in the general pin-type light receiving device by using the measurement system shown in FIG. 7 while the diameter of the mesa constituted by the p-type semiconductor layer and the i-type semiconductor layer was variously set. As an experiment condition, the environment temperature was set to be about 300 K.

As shown in FIG. 8, as the diameter of the mesa increases, the dark current tends to increase. More specifically, when the diameter of the mesa is about 100 $\mu$m, the amount of generated dark current has a linearity depending on the first power of the diameter of the mesa. When the diameter of the mesa is about 1 mm or more, the amount of generated dark current substantially has a linearity depending on the second power of the diameter of the mesa. As a result, it is assumed that the dark current flowing in the interface between the side surface of the mesa and the passivation layer for protecting the surface of the mesa in accordance with the interface state greatly contributes to the measured dark current.

Figure 9:
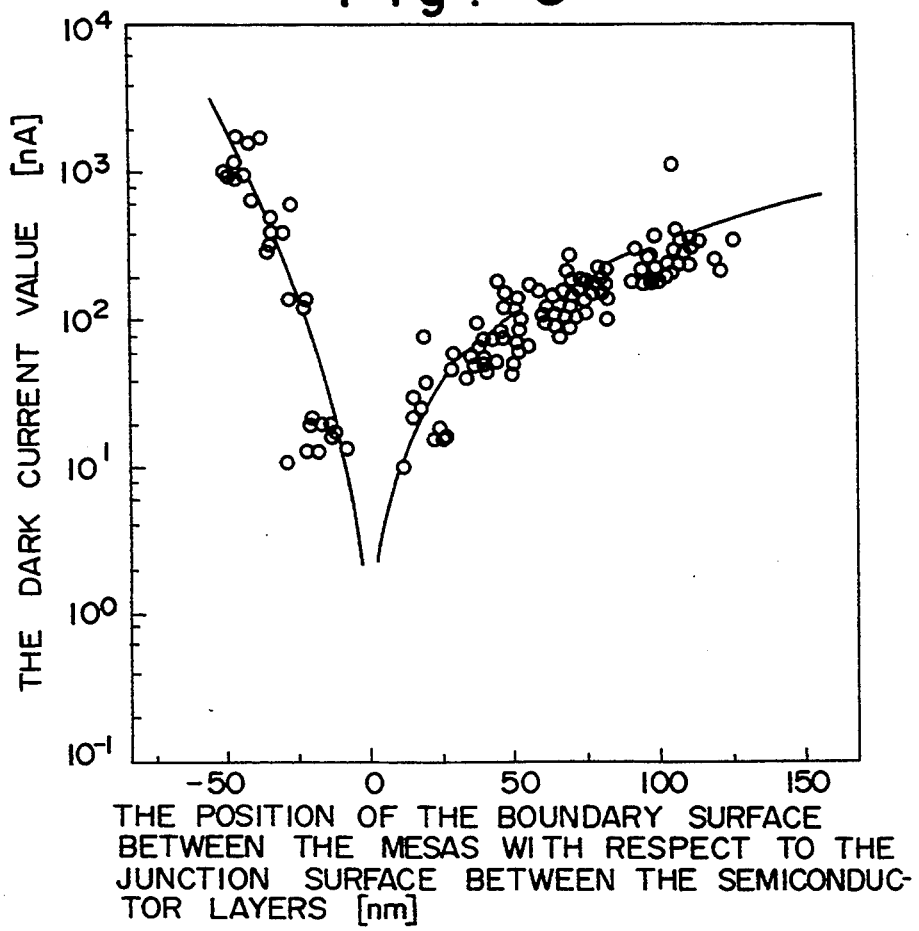
FIGS. 9 and 10 are graphs showing the relationship between the position of the boundary surface between the mesas with respect to the junction surface between the semiconductor layers and the dark current value in the pin-type light receiving device in FIGS. 1 and 2.
Figure 10:
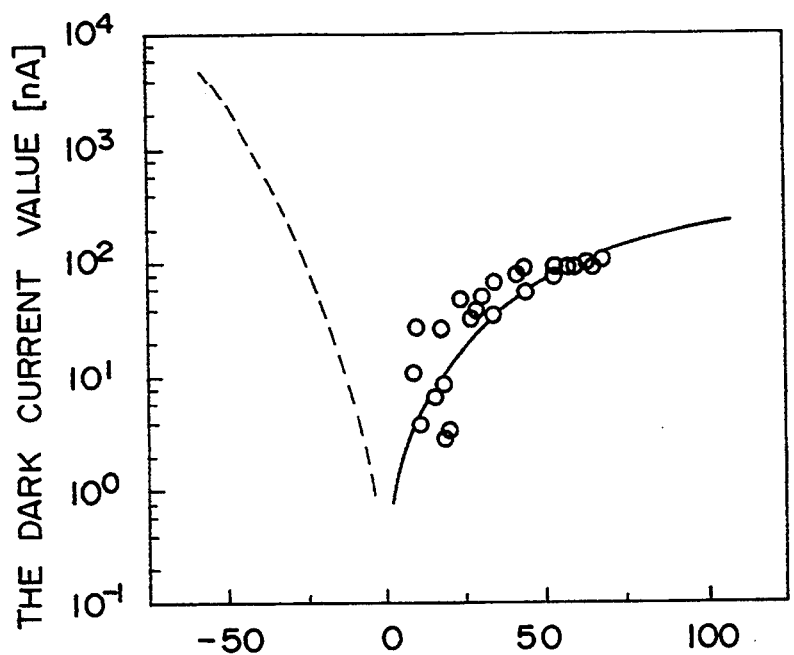

FIGS. 9 and 10 are graphs each showing the relationship between the position of the boundary surface between the mesas with respect to the junction surface between the semiconductor layers and the dark current value in the first embodiment of the pin-type light receiving device. The origin of the abscissa is set to the position of the junction surface between the p-PD layer 13c and the i-PD layer 12a. The distance from the junction surface to the boundary surface between the first mesa mainly constituted by the p-PD layer 13c and the second mesa mainly constituted by the i-PD layer 12a is plotted along the abscissa. The direction from the semiconductor substrate 1 to the junction surface is set to be a negative direction. The value of the generated dark current is plotted in logarithm along the ordinate.

The measurement result of an initial experiment is shown in FIG. 9. The experiment was performed by measuring the dark current in the first embodiment of the pin-type light receiving device by using the measurement system shown in FIG. 7 while the interval between the junction surface of the semiconductor layers and the boundary surface between the mesas is variously set. The measurement result of a reproduction experiment is shown in FIG. 10. The reproduction experiment was performed to confirm the measurement result shown in FIG. 9. As the conditions for these two experiments, the diameter of the first mesa was constantly set to be about 100 $\mu$m and the environment temperature was set to be about 300 K. In the reproduction experiment, no pin-type light receiving device having values in the negative direction of the abscissa was used as the target object for the measurement. Therefore, for the sake of comparison with the initial experiment, one of solid curves in FIG. 9 is indicated by a dotted curve in FIG. 10.

As shown in FIGS. 9 and 10, the measurement results in these two experiments exhibit almost the same tendency that as the boundary surface between the first and second mesas is close to the junction surface between the p-PD layer 13c and the i-PD layer 12a, the generated dark current is reduced. As a result, it is assumed that in order to reduce the dark current to a practical level of several tens nA or less, the boundary surface between the first and second mesas need to be separated from the junction surface between the p-PD layer 13c and the i-PD layer 12a at an interval of about 25 to 50 nm or less.

Figure 11:
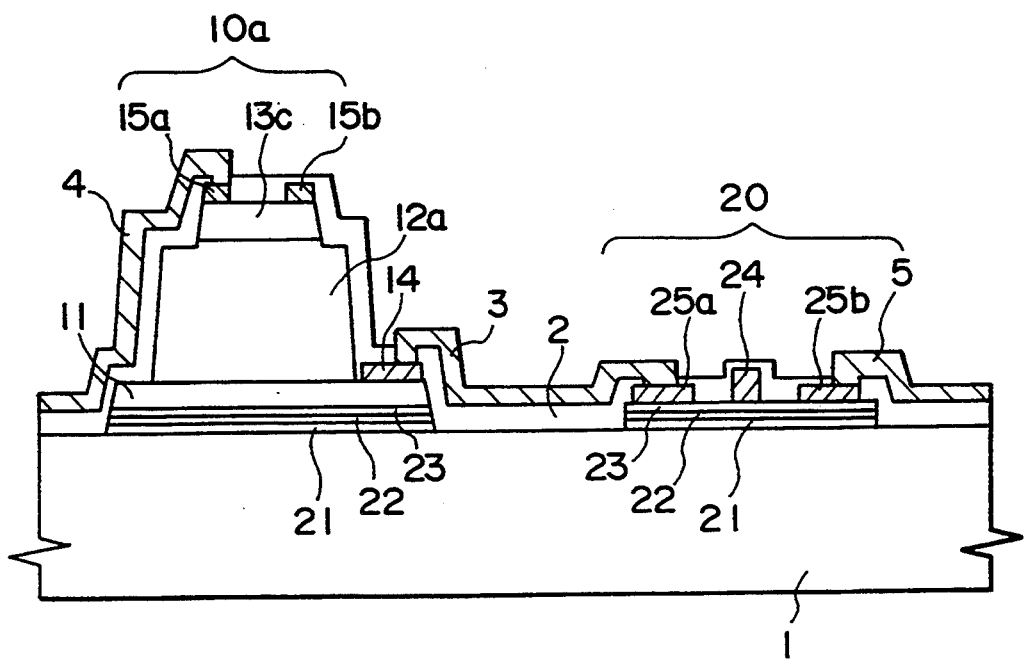
FIG. 11 is a sectional view showing the structure of the first embodiment of an optoelectronic integrated circuit according to the present invention.

FIG. 11 is a sectional view showing the structure of the first embodiment of an optoelectronic integrated circuit according to the present invention. A pin-PD 10a and a HEMT (High Electron Mobility Transistor) 20 are monolithically integrated on the semiconductor substrate 1. In this optoelectronic integrated circuit, a buffer layer 21, a channel layer 22, a electron supply layer 23, an n-PD layer 11, an i-PD layer 12a, and a p-PD layer 13c are sequentially formed on a semiconductor substrate 1.

In the pin-PD 10a, the p-PD layer 13c, the i-PD layer 12a, and the n-PD layer 11 are sequentially formed into mesa shapes to respectively constitute the first mesa, the second mesa, and the third mesa having truncated conical shapes. The n-ohmic electrode layer 14 is formed on the n-PD layer 11 at a predetermined position. The p-ohmic electrode layers 15a and 15b are formed on the p-PD layer 13c at predetermined positions. The pin-PD 10a has the same structure as the pin-type light receiving device of the first embodiment.

In the HEMT 20, the p-PD layer 13c, the i-PD layer 12a, and the n-PD layer 11 are sequentially removed, and the electron supply layer 23, the channel layer 22, and the buffer layer 21 are formed to be separated from the region of the pin-PD 10a. A gate electrode layer 24 and ohmic electrode layers 25a and 25b are formed on the electron supply layer 23 at predetermined positions. A region where the gate electrode layer 24 is formed on the electron supply layer 23 has a recess structure having a recessed portion with a predetermined depth. The device characteristics such as a threshold voltage are controlled in accordance with the depth of the recessed portion.

A passivation layer 2 is formed on the surface of each semiconductor layer of the pin-PD 10a and the HEMT 20. A wiring layer 3 is formed between the n-ohmic electrode layer 14 of the pin-PD 10a and the ohmic electrode layer 25a of the HEMT 20. A wiring layer 4 is formed between the p-ohmic electrode layer 15a of the pin-PD 10a and the electrode layer of an adjacent device (not shown). A wiring layer 5 is formed between the ohmic electrode layer 25b of the HEMT 20 and the electrode layer of an adjacent device (not shown).

The buffer layer 21 consists of InP not intentionally doped with a dopant and has a thickness of about 200 to 300 nm. The channel layer 22 consists of GaInAs not intentionally doped with a dopant and has a thickness of 50 to 100 nm. The electron supply layer 23 consists of AlInAs doped with Si at a dopant concentration of about $5 \times 10^{17}$ to $1 \times 10^{18}$ cm$^{-3}$ and has a thickness of about 100 to 150 nm and the n conductivity type. The gate electrode layer 24 consists of Ti/Pt/Au and has a good Schottky-contact property with respect to the electron supply layer 23. The ohmic electrode layers 25a and 25b consist of AuGe/Ni and have a good ohmic-contact property with respect to the electron supply layer 23. The passivation layer 2 consists of SiN and has isulation properties. The wiring layers 3 to 5 consist of Al and electrically connect the adjacent devices.

The diameter of the first mesa is formed smaller than that of the second mesa. The boundary surface between the first and second mesas is formed to match the junction surface between the p-PD layer 13c and the i-PD layer 12a.

The function of the optoelectronic integrated circuit of the first embodiment will be described below.

In this optoelectronic integrated circuit, the pin-PD 10a and the HEMT 20 are monolithically integrated on the semiconductor substrate 1. In the pin-PD 10a, a depletion layer extending upon application of a reverse bias voltage substantially extends through the i-PD layer 12a in the direction of thickness from the p-PD layer 13c to the n-PD layer 11. As in the pin-type light receiving device of the first embodiment, since the diameter of the first mesa is smaller than that of the second mesa, and the boundary surface between the first and second mesas matches the junction surface between the p-PD layer 13c and the i-PD layer 12a, the depletion layer extending upon application of the reverse bias voltage does not reach the surfaces of the first and second mesas to be exposed. That is, the depletion layer does not reach the interface between the side surface of the i-PD layer and the passivation layer 2.

For this reason, the dark current flowing along the surface of the mesa from the p-PD layer 13c to the i-PD layer 12a in accordance with the interface state is reduced. Therefore, in the HEMT 20, a noise signal input to the ohmic electrode layer 25a through the wiring layer 3 is reduced to improve the receiving sensitivity to the light signal received by the pin-PD 10a.

Figure 12:
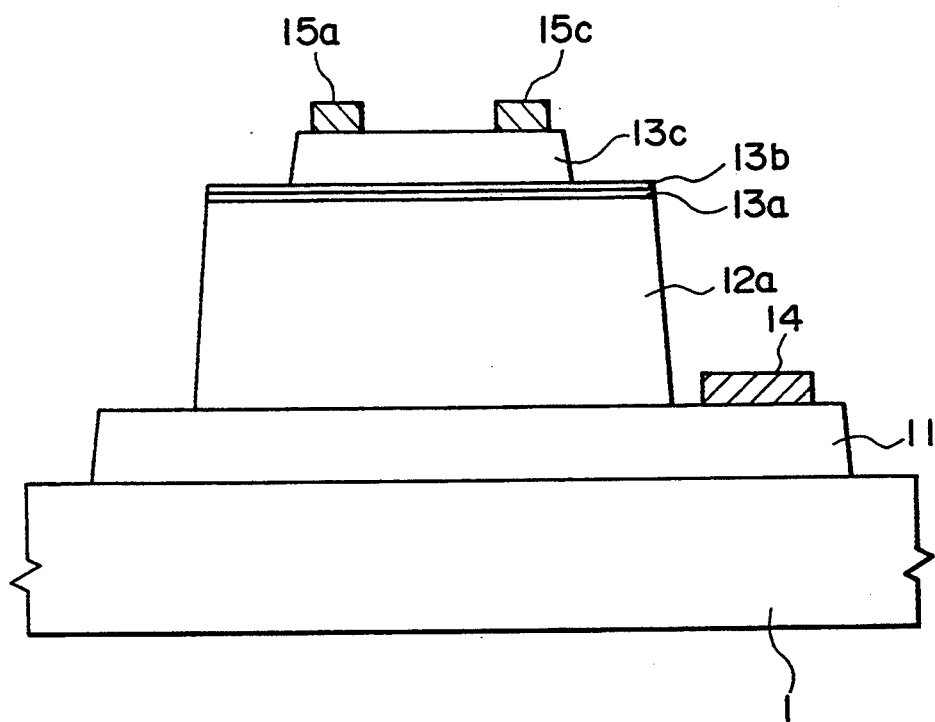
FIG. 12 is a sectional view showing the structure of the second embodiment of a pin-type light receiving device according to the present invention.

FIG. 12 is a sectional view showing the structure of the second embodiment of a pin-type light receiving device according to the present invention. In this pin-type light receiving device, an n-PD layer 11, an i-PD layer 12a, a p-PD layer 13a, an etching stop layer 13b, and a p-PD layer 13c are sequentially formed on a semiconductor substrate 1. The p-PD layer 13c is formed into a mesa shape to constitute the first mesa having a truncated conical shape. The etching stop layer 13b, the p-PD layer 13a, and the i-PD layer 12a are formed into a mesa shape to constitute the second mesa having a truncated conical shape. The n-PD layer 11 is formed into a mesa shape to constitute the third mesa having a truncated conical shape. An n-ohmic electrode layer 14 is formed on the n-PD layer 11 at a predetermined position. P-ohmic electrode layers 15a and 15b are formed on the p-PD layer 13c at predetermined positions. A passivation layer (not shown) is formed on the surface of each mesa.

The semiconductor substrate 1 consists of InP doped with Fe at a predetermined dopant concentration and has semi-isulation properties. The n-PD layer 11 consists of InP doped with Si at a dopant concentration of about $2 \times 10^{18}$ cm$^{-3}$ and has a thickness of about 300 to 500 nm and the n conductivity type. The i-PD layer 12a consists of GaInAs or GaInAsP not intentionally doped with a dopant (at a dopant concentration of about $1 \times 10^{15}$ to $2 \times 10^{15}$ cm$^{-3}$) and has a thickness of about 2.0 to 2.5 μm and a high resistivity. The p-PD layer 13a consists of GaInAs or GaInAsP doped with Zn at a dopant concentration of about $1 \times 10^{19}$ cm$^{-3}$ and has a thickness of about 5 to 10 nm and the p conductivity type. The etching stop layer 13b consists of InP or GaInAsP doped with Zn at a dopant concentration of about $5 \times 10^{18}$ cm$^{-3}$ and has a thickness of about 5 to 10 nm and the p conductivity type. The p-PD layer 13c consists of GaInAs or GaInAsP doped with Zn at a dopant concentration of about $1 \times 10^{19}$ cm$^{-3}$ and has a thickness of about 100 nm and the p conductivity type.

The first mesa mainly constituted by the p-PD layer 13c has a diameter of about 100 μm. The second mesa mainly constituted by the i-PD layer 12a has a diameter of about 120 μm. The third mesa mainly constituted by the n-PD layer 11 has a diameter of about 140 to 150 μm. The n-ohmic electrode layer 14 consists of AuGe/Ni and has a good ohmic-contact property with respect to the n-PD layer 11. The p-ohmic electrode layers 15a and 15b consist of Ti/Pt/Au and have a good ohmic contact with respect to the p-PD layer 13c. The passivation layer (not shown) consists of SiN and has isulation properties.

The diameter of the first mesa is formed smaller than that of the second mesa. The boundary surface between the first and second mesas is formed to match the junction surface between the p-PD layer 13c and the etching stop layer 13b.

When the etching stop layer 13b consisting of GaInAsP is used with respect to the p-PD layer 13c consisting of GaInAs or GaInAsP, the etching selectivities for a phosphoric acid etching solution in these two semiconductor layers change in accordance with the energy band gap, i.e., the composition ratio of GaInAsP. For this reason, the composition ratio of GaInAsP must be considered in advance. Thus, GaInAsP constituting the etching stop layer 13b must have an energy band gap wider than that of GaInAs or GaInAsP constituting the p-PD layer 13c.

When the etching stop layer 13b consisting of InP is used with respect to the p-PD layer 13c consisting of GaInAs, the etching selectivities for a phosphoric acid etching solution in these two semiconductor layers are completely different from each other.

When the etching stop layer 13b consisting of InP is used with respect to the p-PD layer 13c consisting of GaInAsP, the etching selectivities for a phosphoric acid etching solution in these two semiconductor layers change in accordance with the energy band gap, i.e., the composition ratio of GaInAsP. For this reason, the composition ratio of GaInAsP must be considered in advance. Thus, GaInAsP constituting the p-PD layer 13c must have an energy band gap narrower than that of InP constituting the etching stop layer 13b.

When the etching stop layer 13b is formed directly on the i-PD layer 12a without forming the p-PD layer 13a, the heterojunction between the i-PD layer 12a and the etching stop layer 13b may cause an increase in dark current depending on its quality. Therefore, the quality of the heterojunction must be considered in advance.

The function of the second embodiment of the pin-type light receiving device will be described below.

In this pin-type light receiving device, the first mesa mainly constituted by the p-PD layer 13c and the second mesa mainly constituted by the i-PD layer 12a are formed. A depletion layer extending upon application of a reverse bias voltage substantially extends through the i-PD layer 12a in a direction of thickness from the p-PD layer 13c to the n-PD layer 11.

Since the etching stop layer 13b and the p-PD layer 13a are very thin, and the diameter of the first mesa is smaller than that of the second mesa, the depletion layer extending from the p-PD layer 13c hardly extends beyond the diameter of the first mesa in a radial direction. For this reason, the depletion layer does not reach the surface of the second mesa to be exposed. Since the boundary surface between the first and second mesas matches the junction surface between the p-PD layer 13c and the etching stop layer 13b and a carrier concentration of the p-PD layer 13c is much higher than that of the i-PD layer 12a, the depletion layer extending from the p-PD layer 13c hardly extends within the first mesa in the direction of thickness. For this reason, the depletion layer does not reach the surface of the first mesa to be exposed.

The etching stop layer 13b is formed between the p-PD layer 13c and the p-PD layer 13a and has an etching selectivity different from that of the p-PD layer 13c. For this reason, even when the etching process for the p-PD layer 13c is continuously performed to the etching stop layer 13b, the etching rate is suppressed or substantially becomes zero. Thus, the boundary surface between the first and second mesas is set with high reproducibility to almost match the junction surface between the p-PD layer 13c and the etching stop layer 13b.

Therefore, the depletion layer does not reach the surfaces of the first and second mesas to be exposed. That is, the depletion layer does not reach the interface between the side surface of the i-PD layer 12a and the passivation layer (not shown) for protecting the surface of the i-PD layer 12a. As a result, the dark current flowing along the surface of the mesa from the p-PD layer 13c to the i-PD layer 12a in accordance with the interface state is reduced.

Steps in the manufacture of the second embodiment of the pin-type light receiving device will be described below. FIGS. 13 to 17 are sectional views showing the steps in the manufacture of the second embodiment of the pin-type light receiving device.

Figure 13:
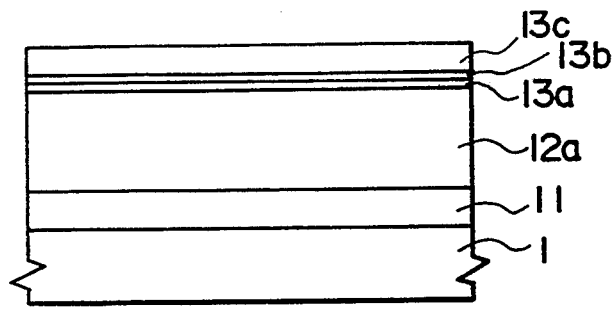
FIGS. 13 to 17 are sectional views showing steps in the manufacture of the pin-type light receiving device in FIG. 12.

By conventional OMVPE method, the n-PD layer 11, the i-PD layer 12a, the p-PD layer 13a, the etching stop layer 13b, and the p-PD layer 13c are sequentially formed on the semiconductor substrate 1 (FIG. 13).

Figure 14:
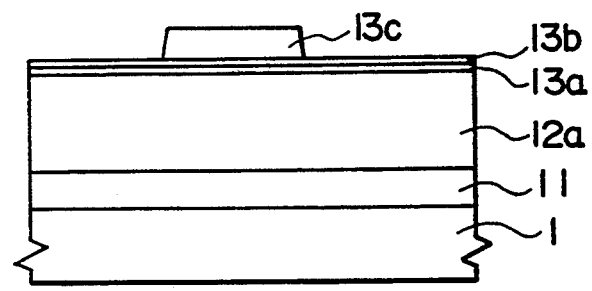

By conventional photolithography technique, the first mask pattern having a predetermined circular shape is formed on the p-PD layer 13c. The p-PD layer 13c is formed into a mesa shape by conventional wet etching method using a phosphoric acid etching solution to form the first mesa. Since the p-PD layer 13c has an etching selectivity different from that of the etching stop layer 13b, when the etching depth reaches the surface of etching stop layer 13b, etching for the p-PD layer 13c is stopped (FIG. 14).

Figure 15:
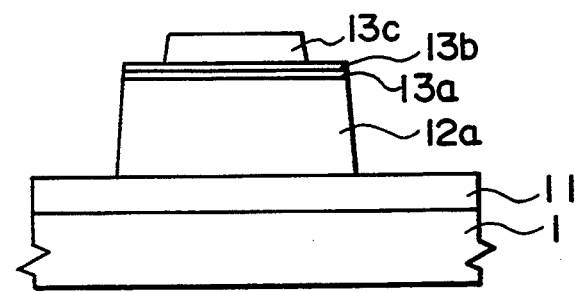

By conventional photolithography technique, the second mask pattern having a predetermined circular shape is formed on the p-PD layer 13c and the etching stop layer 13b. The etching stop layer 13b is formed into a mesa shape by conventional wet etching using a hydrochloric acid etching solution. Subsequently, the p-PD layer 13a and the i-PD layer 12a are formed into a mesa shape by conventional wet etching using a phosphoric acid etching solution to form the second mesa. Since the i-PD layer 12a has an etching selectivity different from that of the n-PD layer 11, when the etching depth reaches the surface of the n-PD layer 11, etching for the p-PD layer 13a and the p-PD layer 12a is stopped. The diameter of the second mask pattern is larger than that of the first mask pattern (FIG. 15).

Figure 16:
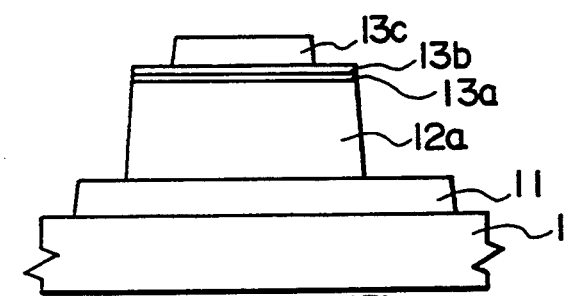

By conventional photolithography technique, the third mask pattern having a predetermined circular shape is formed on the n-PD layer 11. The n-PD layer 11 is formed into a mesa shape by conventional wet etching using a hydrochloric acid etching solution to form the third mesa (FIG. 16).

Figure 17:
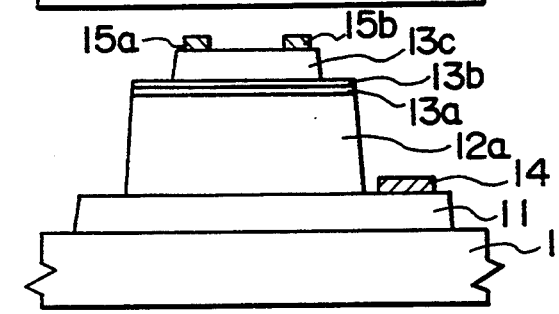

Subsequently, by conventional plasma CVD method, a passivation layer (not shown) is deposited on the n-PD layer 11, the i-PD layer 12a, and the p-PD layer 13c. By conventional RIE, the passivation layer on the n-PD layer 11 and the p-PD layer 13c is removed from predetermined positions to form openings for forming electrodes. By conventional vacuum deposition method, the n-ohmic electrode layer 14 is deposited in the opening on the n-PD layer 11, and the p-ohmic electrode layers 15a and 15b are deposited in the openings on the p-PD layer 13c (FIG. 17).

Figure 18:
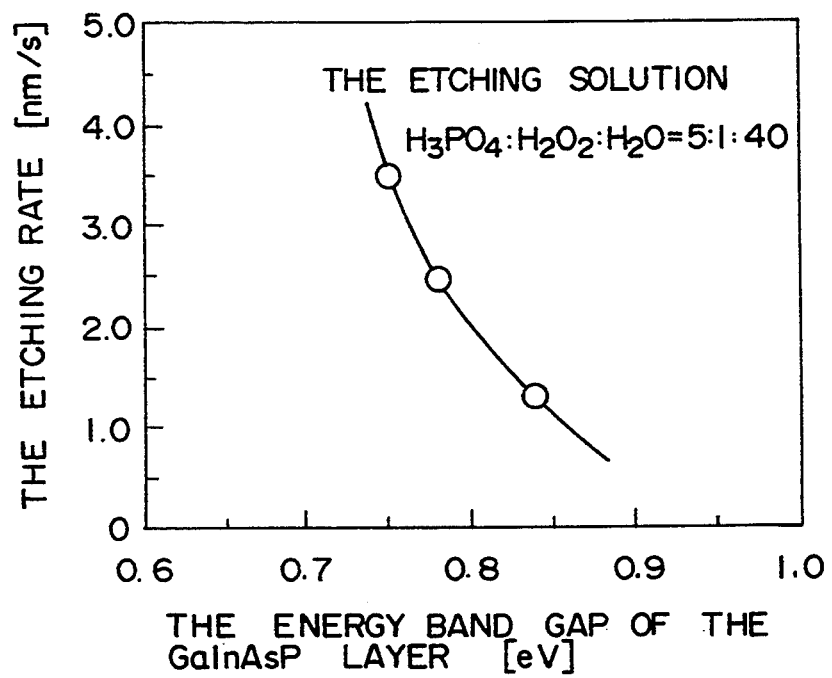
FIG. 18 is a graph showing the relationship between the energy band gap of a GaInAsP layer and the etching rate in the pin-type light receiving device in FIG. 12.

An experiment about the pin-type light receiving device of the second embodiment will be described below. FIG. 18 is a graph showing the relationship between the energy band gap of the GaInAsP layer and the etching rate in the pin-type light receiving device of the second embodiment. The energy band gap of GaInAsP constituting the etching stop layer 13b is plotted along the abscissa. The etching rate in etching of GaInAsP using a phosphoric acid etching solution is plotted along the ordinate. The measurement values represented by hollow dots were obtained by using GaInAsP having an energy band gap lattice-matched with InP as a target object for measurement. The component volume ratio of the etching solution was $H_3PO_4 : H_2O_2 : H_2O = 5 : 1 : 40$.

As shown in FIG. 18, as the energy band gap of GaInAsP is increased, the etching rate in etching of GaInAsP using a phosphoric acid solution tends to decrease. When the etching stop layer 13b consisting of GaInAsP is used with respect to the p-PD layer 13c consisting of GaInAs or GaInAsP, the etching selectivities for a phosphoric acid etching solution in these two semiconductor layers change in accordance with the energy band gap, i.e., the composition ratio of GaInAsP. In this case, the energy band gap of GaInAs is about 0.75 eV. Therefore, when the p-PD layer 13c is formed of GaInAs, the energy band gap of GaInAs constituting the etching stop layer 13b must be 0.75 eV or more. When the p-PD layer 13c is formed of GaInAsP, GaInAsP constituting the etching stop layer 13b must have an energy band gap wider than that of GaInAsP constituting the p-PD layer 13c.

When the etching stop layer 13b consisting of InP is used with respect to the p-PD layer 13c consisting of GaInAs, the etching selectivities for a phosphoric acid etching solution in these two semiconductor layers are completely different from each other. This is because the energy band gaps of GaInAs and InP are about 0.75 eV and about 1.35 eV, respectively, to exhibit a sufficiently large difference.

When the etching stop layer 13b consisting of InP is used with respect to the p-PD layer 13c consisting of GaInAsP, the etching selectivities for a phosphoric acid etching solution in these two semiconductor layers change in accordance with the energy band gap, i.e., the composition ratio of GaInAsP. In this case, the energy band gap of InP is about 1.35 eV. Therefore, the energy band gap of GaInAsP constituting the p-PD layer 13c must be about 1.35 eV or less.

Figure 19:
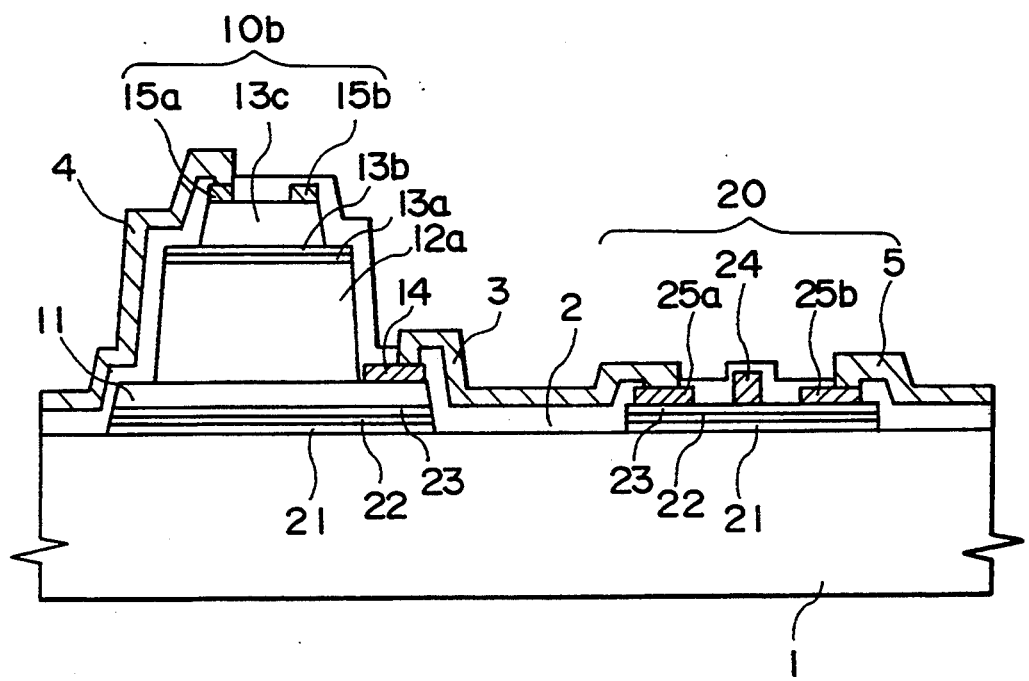
FIG. 19 is a sectional view showing the structure of the second embodiment of an optoelectronic integrated circuit according to the present invention.

FIG. 19 is a sectional view showing the structure of the second embodiment of an optoelectronic integrated circuit according to the present invention. A pin-PD 10b and a HEMT 20 are monolithically integrated on the semiconductor substrate 1. In this optoelectronic integrated circuit, a buffer layer 21, channel layer 22, an electron supply layer 23, an n-PD layer 11, an i-PD layer 12a, a p-PD layer 13a, an etching stop layer 13b, and a p-PD layer 13c are sequentially formed on the semiconductor substrate 1.

In the pin-PD 10b, the p-PD layer 13c is formed into a mesa shape to constitute the first mesa having a truncated conical shape. The etching stop layer 13b, the p-PD layer 13a, and the i-PD layer 12a are formed into a mesa shape to constitute the second mesa having a truncated conical shape. The n-PD layer 11 is formed into a mesa shape to constitute the third mesa having a truncated conical shape. The n-ohmic electrode layer 14 is formed on the n-PD layer 11 at a predetermined position. The p-ohmic electrode layers 15a and 15b are formed on the p-PD layer 13c at predetermined positions. The pin-PD 10b has the same structure as the second embodiment of the pin-type light receiving device.

In the HEMT 20, the p-PD layer 13c, the etching stop layer 13b, the p-PD layer 13a, the i-PD layer 12a, and the n-PD layer 11 are sequentially removed. The electron supply layer 23, the channel layer 22, and the buffer layer 21 are separated from the region of the pin-PD 10b. A gate electrode layer 24 and ohmic electrode layers 25a and 25b are formed on the electron supply layer 23 at predetermined positions. A region where the gate electrode layer 24 is formed on the electron supply layer 23 has a recess structure having a recessed portion with a predetermined depth. The device characteristics such as a threshold voltage are controlled in accordance with the depth of the recessed portion. The HEMT 20 has the same structure as the first embodiment of the optoelectronic integrated circuit.

A passivation layer 2 is formed on the surface of each semiconductor layer of the pin-PD 10b and the HEMT 20. A wiring layer 3 is formed between the n-ohmic electrode layer 14 of the pin-PD 10b and the ohmic electrode layer 25a of the HEMT 20. A wiring layer 4 is formed between the p-ohmic electrode layer 15a of the pin-PD 10b and the electrode layer of an adjacent device (not shown). A wiring layer 5 is formed between the ohmic electrode layer 25b of the HEMT 20 and the electrode layer of an adjacent device (not shown).

The diameter of the first mesa is formed smaller than that of the second mesa. The boundary surface between the first and second mesas is formed to match the junction surface between the p-PD layer 13c and the etching stop layer 13b.

The function of the second embodiment of the optoelectronic integrated circuit will be described below.

In this optoelectronic integrated circuit, the pin-PD 10b and the HEMT 20 are monolithically integrated on the semiconductor substrate 1. In the pin-PD 10b, a depletion layer extending upon application of a reverse bias voltage substantially extends through the i-PD layer 12a in the direction of thickness from the p-PD layer 13c to the n-PD layer 11. As in the pin-type light receiving element of the second embodiment, since the diameter of the first mesa is smaller than that of the second mesa, and the boundary surface between the first and second mesas matches the junction surface between the p-PD layer 13c and the etching stop layer 13b, the depletion layer extending upon application of the reverse bias voltage does not reach the surfaces of the first and second mesas to be exposed. That is, the depletion layer does not reach the interface between the side surface of the i-PD layer 12a and the passivation layer 2.

The etching stop layer 13b is formed between the p-PD layer 13c and the p-PD layer 13a and has an etching selectivity different from that of the p-PD layer 13c. For this reason, even when the etching process for the p-PD layer 13c is continuously performed for the etching stop layer 13b, the etching rate is suppressed or substantially becomes zero. Thus, the boundary surface between the first and second mesas is set with high reproducibility to almost match the junction surface between the p-PD layer 13c and the etching stop layer 13b.

The dark current flowing along the surface of the mesa from the p-PD layer 13c to the i-PD layer 12a in accordance with the interface state is reduced. Therefore, in the HEMT 20, a noise signal input to the ohmic electrode layer 25a through the wiring layer 2 is decreased to improve the receiving sensitivity to the light signal received by the pin-PD 10b.

Figure 20:
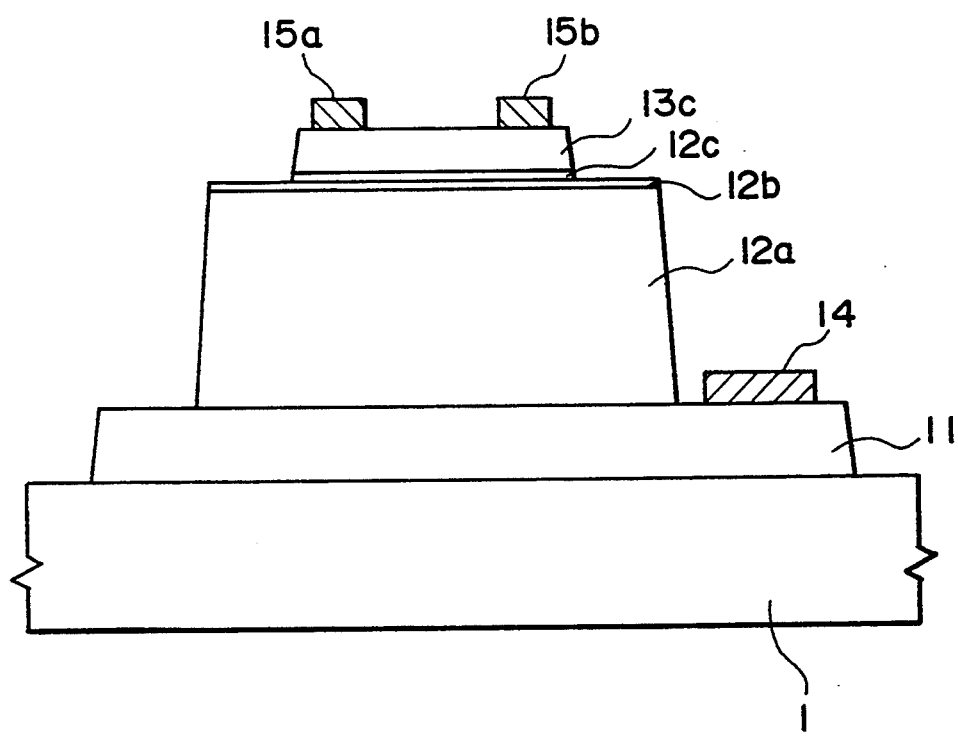
FIG. 20 is a sectional view showing the structure of the third embodiment of a pin-type light receiving device according to the present invention.

FIG. 20 is a sectional view showing the structure of the third embodiment of a pin-type light receiving device according to the present invention. In this pin-type light receiving device, an n-PD layer 11, an i-PD layer 12a, an etching stop layer 12b, an i-PD layer 12c, and a p-PD layer 13c are sequentially formed on a semiconductor substrate 1. The p-PD layer 13c and the i-PD layer 12 c are formed into a mesa shape to constitute the first mesa having a truncated conical shape. The etching stop layer 12b and the i-PD layer 12a are formed into a mesa shape to constitute the second mesa having a truncated conical shape. The n-PD layer 11 is formed into a mesa shape to constitute the third mesa having a truncated conical shape. An n-ohmic electrode layer 14 is formed on the n-PD layer 11 at a predetermined position. P-ohmic electrode layers 15a and 15b are formed on the p-PD layer 13c at predetermined positions. A passivation layer (not shown) is formed on the surface of each mesa.

The semiconductor substrate 1 consists of InP doped with Fe at a predetermined dopant concentration and has semi-isulation properties. The n-PD layer 11 consists of InP doped with Si at a dopant concentration of about $2 \times 10^{18}$ cm$^{-3}$ and has a thickness of about 300 to 500 nm and the n conductivity type. The i-PD layer 12a consists of GaInAs or GaInAsP not intentionally doped with a dopant (at a dopant concentration of about $1 \times 10^{15}$ to $2 \times 10^{15}$ cm$^{-3}$) and has a thickness of about 2.0 to 2.5 μm and a high resistivity. The etching stop layer 12b consists of InP or GaInAsP not intentionally doped with a dopant and has a thickness of about 5 to 10 nm and a high resistivity. The i-PD layer 12 c consists of GaInAs or GaInAsP not intentionally doped with a dopant and has a thickness of about 5 to 10 nm and a high resistivity. The p-PD layer 13c consists of GaInAs or GaInAsP doped with Zn at a dopant concentration of about $5 \times 10^{18}$ cm$^{-3}$ and has a thickness of about 100 nm and the p conductivity type.

The first mesa mainly constituted by the p-PD layer 13c has a diameter of about 100 μm. The second mesa mainly constituted by the i-PD layer 12a has a diameter of about 120 μm. The third mesa mainly constituted by the n-PD layer 11 has a diameter of about 140 to 150 μm. The n-ohmic electrode layer 14 consists of AuGe/Ni and has a good ohmic-contact property with respect to the n-PD layer 11. The p-ohmic electrode layers 15a and 15b consist of Ti/Pt/Au and has a good ohmic-contact property with respect to the p-PD layer 13c. The passivation layer (not shown) consists of SiN and has isulation properties.

The diameter of the first mesa is formed smaller than that of the second mesa. The boundary surface between the first and second mesas is formed to match the junction surface between the i-PD layer 12 c and the etching stop layer 12b.

When the etching stop layer 12b consisting of GaInAsP is used with respect to the i-PD layer 12 c consisting of GaInAs or GaInAsP, the etching selectivities for a phosphoric acid etching solution in these two semiconductor layers change in accordance with the energy band gap, i.e., the composition ratio of GaInAsP. For this reason, the composition ratio of GaInAsP must be considered in advance. Thus, GaInAsP constituting the etching stop layer 12b must have an energy band gap wider than that of GaInAs or GaInAsP constituting the i-PD layer 12c.

When the etching stop layer 12b consisting of InP is used with respect to the i-PD layer 12 c consisting of GaInAs, the etching selectivities for a phosphoric acid etching solution in these two semiconductor layers are completely different from each other.

When the etching stop layer 12b consisting of InP is used with respect to the i-PD layer 12 c consisting of GaInAsP, the etching selectivities for a phosphoric acid etching solution in these two semiconductor layers change in accordance with the band energy gap, i.e., the composition ratio of GaInAsP. For this reason, the composition ratio of GaInAsP must be considered in advance. Thus, GaInAsP constituting the i-PD layer 12 c must have an energy band gap narrower than that of InP constituting the etching stop layer 12b.

When the p-PD layer 13c is formed directly on the etching stop layer 12b without forming the i-PD layer 12c, the heterojunction between the etching stop layer 12b and the p-PD layer 13c may cause an increase in dark current depending on its quality. For this reason, the quality of the heterojunction must be considered in advance.

When the etching stop layer 12b consisting of GaInAsP is used with respect to the p-PD layer 13c consisting of GaInAs or GaInAsP, the etching selectivities for a phosphoric acid etching solution in these two semiconductor layers change in accordance with the energy band gap, i.e., the composition ratio of GaInAsP. For this reason, the composition ratio of GaInAsP must be considered in advance. Thus, GaInAsP constituting the etching stop layer 12b must have an energy band gap wider than that of GaInAs or GaInAsP constituting the p-PD layer 13c.

When the etching stop layer 12b consisting of InP is used with respect to the p-PD layer 13c consisting of GaInAs, the etching selectivities for a phosphoric acid etching solution in these two semiconductor layers are completely different from each other.

When the etching stop layer 12b consisting of InP is used with respect to the p-PD layer 13c consisting of GaInAsP, the etching selectivities for a phosphoric acid etching solution in these two semiconductor layers change in accordance with the energy band gap, i.e., the composition ratio of GaInAsP. For this reason, the composition ratio of GaInAsP must be considered in advance. Thus, GaInAsP constituting the p-PD layer 13c must have an energy band gap narrower than that of InP constituting the etching stop layer 12b.

The function of the third embodiment of the pin-type light receiving device will be described below.

In this pin-type light receiving device, the first mesa mainly constituted by the p-PD layer 13c and the second mesa mainly constituted by the i-PD layer 12a are formed. A depletion layer extending upon application of a reverse bias voltage substantially extends through the i-PD layer 12a in the a direction of thickness from the p-PD layer 13c to the n-PD layer 11.

Since the diameter of the first mesa is smaller than that of the second mesa, the depletion layer extending from the p-PD layer 13c hardly extends beyond the diameter of the first mesa in the radial direction. For this reason, the depletion layer does not reach the surface of the second mesa to be exposed. Since the boundary surface between the first and second mesas matches the junction surface between the p-PD layer 12a and the etching stop layer 12b and the i-PD layer 12 c and the etching stop layer 12b are very thin and a carrier concentration of the p-PD layer 13c is much higher than that of the i-PD layer 12a, the depletion layer extending from the p-PD layer 13c slightly extends within the first mesa in the direction of thickness. For this reason, the depletion layer does not reach the surface of the first mesa to be exposed.

When the etching stop layer 12b is formed between the i-PD layer 12 c and the i-PD layer 12a, the etching stop layer 12b has an etching selectivity different from that of the i-PD layer 12c. For this reason, even when the etching process for the i-PD layer 12 c is continuously performed for the etching stop layer 12b, the etching rate is suppressed or substantially becomes zero. On the other hand, when the etching stop layer 12b is formed between the p-PD layer 13c and the i-PD layer 12a, the etching stop layer 12b has an etching selectivity different from that of the p-PD layer 13c. For this reason, even when the etching process for the p-PD layer 13c is continuously performed for the etching stop layer 12b, the etching rate is suppressed or substantially becomes zero. That is, the boundary surface between the first and second mesas is set with high reproducibility to almost match the junction surface between the i-PD layer 12 c and the etching stop layer 12b.

Therefore, the depletion layer does not reach the surfaces of the first and second mesas to be exposed. That is, the depletion layer does not reach the interface between the side surface of the i-PD layer 12a and the passivation layer (not shown) for protecting the surface of the i-PD layer. As a result, the dark current flowing along the surface of the mesa from the p-PD layer 13c to the i-PD layer 12a in accordance with the interface state is reduced.

Steps in the manufacture of the pin-type light receiving device of the third embodiment will be described below. FIGS. 21 to 25 are sectional views showing the steps in the manufacture of the third embodiment of the pin-type light receiving device.

Figure 21:
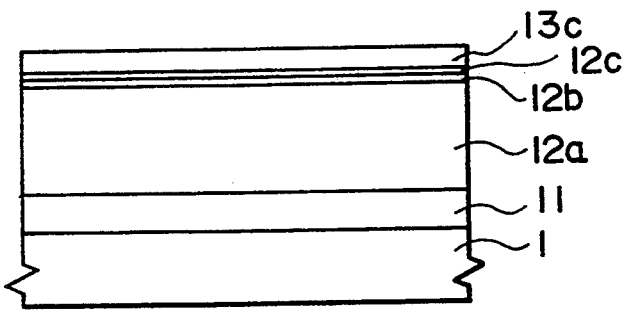
FIGS. 21 to 25 are sectional views showing steps in the manufacture of the pin-type light receiving device in FIG. 20.

By conventional OMVPE method, the n-PD layer 11, the i-PD layer 12a, the etching stop layer 12b, the i-PD layer 12c, and the p-PD layer 13c are sequentially formed on the semiconductor substrate 1. The i-PD layer 12 c is not necessarily formed (FIG. 21).

Figure 22:
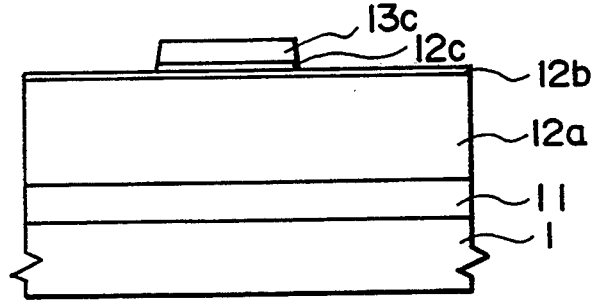

By conventional photolithography technique, the first mask pattern having a predetermined circular shape is formed on the p-PD layer 13c. The p-PD layer 13c and the i-PD layer 12 c are formed into a mesa shape by conventional wet etching method using a phosphoric acid etching solution to form the first mesa. Since the i-PD layer 12 c has an etching selectivity different from that of the etching stop layer 12b, when the etching depth reaches the surface of the etching stop layer 12b, etching for the i-PD layer 12 c is stopped. When the i-PD layer 12 c is not formed, and the etching depth reaches the surface of the etching stop layer 12b, the etching process for the p-PD layer 13c is stopped because the p-PD layer 13c has an etching selectivity different from that of the etching stop layer 12b (FIG. 22).

Figure 23:
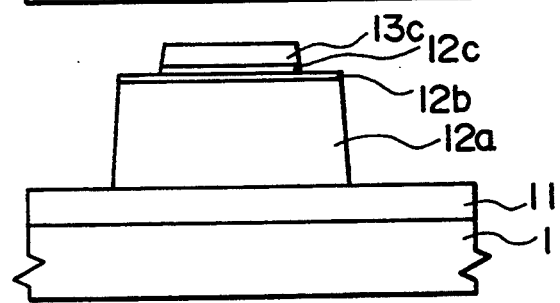

By conventional photolithography technique, the second mask pattern having a predetermined circular shape is formed on the p-PD layer 13c, the i-PD layer 12c, and the etching stop layer 12b. The etching stop layer 12b is formed into a mesa shape by conventional wet etching method using a hydrochloric acid etching solution. The i-PD layer 12ais formed into a mesa shape by conventional wet etching using a phosphoric acid etching solution to form the second mesa. Since the i-PD layer 12a has an etching selectivity different from that of the n-PD layer 11, when the etching depth reaches the surface of the n-PD layer 11, the etching process for the i-PD layer 12a is stopped. The diameter of the second mask pattern is larger than that of the first mask pattern (FIG. 23).

Figure 24:
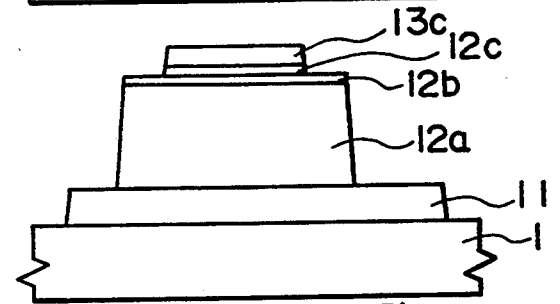

By conventional photolithography technique, the third mask pattern having a predetermined circular shape is formed on the n-PD layer 11. The n-PD layer 11 is formed into a mesa shape by conventional wet etching using a hydrochloric acid etching solution to form the third mesa (FIG. 24).

Figure 25:
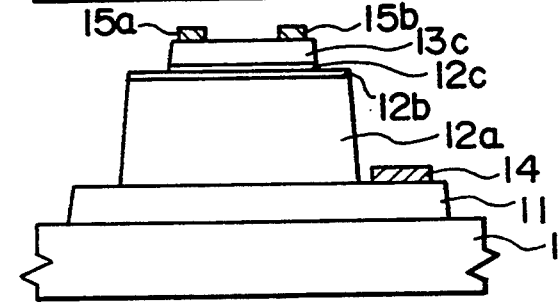

By conventional plasma CVD method, a passivation layer (not shown) is deposited on the n-PD layer 11, the i-PD layer 12a, and the p-PD layer 13c. The passivation layer on the n-PD layer 11 and the p-PD layer 13c is removed from predetermined positions by conventional RIE to form openings for forming electrodes. By conventional vacuum deposition method, the n-ohmic electrode layer 14 is deposited in the opening on the n-PD layer 11, and the p-ohmic electrode layers 15a and 15b are deposited in the openings on the p-PD layer 13c (FIG. 25).

Figure 26:
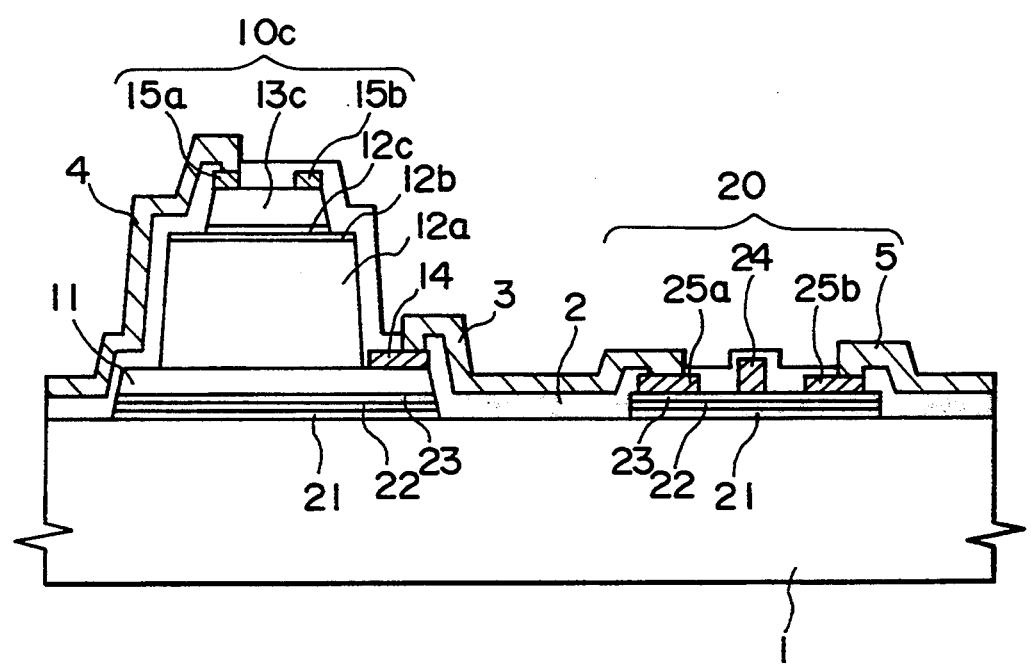
FIG. 26 is a sectional view showing the structure of the third embodiment of an optoelectronic integrated circuit according to the present invention.

FIG. 26 is a sectional view showing the structure of the third embodiment of an optoelectronic integrated circuit according to the present invention. A pin-PD 10c and a HEMT 20 are monolithically integrated on the semiconductor substrate 1. In this optoelectronic integrated circuit, a buffer layer 21, a channel layer 22, an electron supply layer 23, an n-PD layer 11, an i-PD layer 12a, a p-PD layer 13a, an etching stop layer 13b, and a p-PD layer 13c are sequentially formed on the semiconductor substrate 1.

In the pin-PD 10c, the p-PD layer 13c and the i-PD layer 12 c are formed into a mesa shape to constitute the first mesa having a truncated conical shape. The etching stop layer 12b and the i-PD layer 12a are formed into a mesa shape to constitute the second mesa having a truncated conical shape. The n-PD layer 11 is formed into a mesa shape to constitute the third mesa having a truncated conical shape. The n-ohmic electrode layer 14 is formed on the n-PD layer 11 at a predetermined position. The p-ohmic electrode layers 15a and 15b are formed on the p-PD layer 13c at predetermined positions. The pin-PD 10c has the same structure as the third embodiment of the pin-type light receiving device.

In the HEMT 20, the p-PD layer 13c, the i-PD layer 12c, the etching stop layer 12b, the i-PD layer 12a, and the n-PD layer 11 are sequentially removed. The electron supply layer 23, the channel layer 22, and the buffer layer 21 are separated from the region of the pin-PD 10c. A gate electrode layer 24 and ohmic electrode layers 25a and 25b are formed on the electron supply layer 23 at predetermined positions. A region where the gate electrode layer 24 is formed on the electron supply layer 23 has a recess structure having a recessed portion with a predetermined depth. The device characteristics such as a threshold voltage are controlled in accordance with the depth of the recessed portion. The HEMT 20 has the same structure as the first and second embodiments of the optoelectronic integrated circuits.

A passivation layer 2 is formed on the surface of each semiconductor layer of the pin-PD 10c and the HEMT 20. A wiring layer 3 is formed between the n-ohmic electrode layer 14 of the pin-PD 10c and the ohmic electrode layer 25a of the HEMT 20. A wiring layer 4 is formed between the p-ohmic electrode layer 15a of the pin-PD 10c and the electrode layer of an adjacent device (not shown). A wiring layer 5 is formed between the ohmic electrode layer 25b of the HEMT 20 and the electrode layer of an adjacent device (not shown).

The diameter of the first mesa is formed smaller than that of the second mesa. The boundary surface between the first and second mesas is formed to match the junction surface between the p-PD layer 12 c and the etching stop layer 12b.

The function of the optoelectronic integrated circuit of the third embodiment will be described below.

In this optoelectronic integrated circuit, the pin-PD 10c and the HEMT 20 are monolithically integrated on the semiconductor substrate 1. In the pin-PD 10c, a depletion layer extending upon application of a reverse bias voltage substantially extends through the i-PD layer 12a in a direction of thickness from the p-PD layer 13c to the n-PD layer 11. As in the third embodiment of the pin-type light receiving device, the diameter of the first mesa is smaller than that of the second mesa. The boundary surface between the first and second mesas matches the junction surface between the i-PD layer 12 c and the etching stop layer 12b. For this reason, the depletion layer extending upon application of the reverse bias voltage does not reach the surfaces of the first and second mesas to be exposed. That is, the depletion layer does not reach the interface between the side surface of the i-PD layer 12a and the passivation layer 2.

The etching stop layer 12b is formed between the i-PD layer 12 c and the i-PD layer 12a and has an etching selectivity different from that of the p-PD layer 13c. For this reason, even when the etching process for the p-PD layer 13c is continuously performed for the etching stop layer 12b, the etching rate is suppressed or substantially becomes zero. Thus, the boundary surface between the first and second mesas is set with high reproducibility to almost match the junction surface between the i-PD layer 12 c and the etching stop layer 12b.

The dark current flowing along the surface of the mesa from the p-PD layer 13c to the i-PD layer 12a in accordance with the interface state is reduced. Therefore, in the HEMT 20, a noise signal input to the ohmic electrode layer 25a through the wiring layer 2 is decreased to improve the receiving sensitivity to the light signal received by the pin-PD 10c.

The present invention is not limited to the above specific embodiments and various modifications can be made.

For example, the component materials of the pin-type light receiving devices and the optoelectronic integrated circuits of the above embodiments are not limited to specific ones. In the pin-type light receiving devices, the p-type semiconductor layers consist of p-GaInAs or p-GaInAsP. However, the p-type semiconductor layer may be formed of p-InP to obtain the same effect as in the above embodiments.

In the pin-type light receiving devices of the above embodiments, the etching stop layers formed within the p-type semiconductor layers consisting of p-GaInAs or p-GaInAsP are formed of p-GaInAsP or p-InP. However, the etching stop layer may be formed of other materials to obtain the same effect as in the above embodiments as far as the etching stop layer has an etching selectivity different from that of the p-type semiconductor layer.

In the pin-type light receiving devices of the above embodiments, a phosphoric acid etching solution is used for the p-type semiconductor layers consisting of p-GaInAs, and a hydrochloric acid etching solution is used for the etching stop layers formed of p-GaInAsP or p-InP within the p-type semiconductor layers. However, these two etching solutions may consist of other components to obtain the same effect as in the above embodiments as far as the etching solution has different etching selectivities for the p-type semiconductor layer and the etching stop layer formed therein.

In the pin-type light receiving devices of the above embodiments, the etching stop layers formed within the i-type semiconductor layers consisting of i-GaInAs are formed of i-GaInAsP or i-InP. However, the etching stop layer may be formed of other materials to obtain the same effect as in the above embodiments as far as the etching stop layer has an etching selectivity different from that of the i-type semiconductor layer.

In the pin-type light receiving devices of the above embodiments, a phosphoric acid etching solution is used for the p-type semiconductor layers consisting of i-GaInAs, and a hydrochloric acid etching solution is used for the etching stop layers formed of i-GaInAsP or i-InP within the i-type semiconductor layers. However, these two etching solutions may consist of other components to obtain the same effect as in the above embodiments as far as the etching solution has different etching selectivities for the i-type semiconductor layers and the etching stop layer formed therein.

In the optoelectronic integrated circuits of the above embodiments, an HEMT is used as a typical field effect transistor serving as an electronic circuit device. However, in place of the HEMT, an HBT (Heterojunction Bipolar Transistor) or the like may be used as a typical bipolar transistor to obtain the same effect as in the above embodiments.

As has been described above, according to a pin-type light receiving device of the present invention, the first mesa constituted by a p-type semiconductor layer has a diameter smaller than that of the second mesa constituted by an i-type semiconductor layer. The boundary surface between the first and second mesas matches the junction surface between the p-type semiconductor layer and the i-type semiconductor layer. For this reason, a depletion layer extending upon application of a reverse bias voltage does not reach the surfaces of the first and second mesas to be exposed. A dark current flowing along the surface of the mesa from the p-type semiconductor layer to the i-type semiconductor layer in accordance with the interface state is reduced. Therefore, a pin-type light receiving device whose device characteristics are improved by reduction of the dark current can be obtained.

When the etching stop semiconductor layer is arranged in contact with the junction surface between the p-type semiconductor layer and the i-type semiconductor layer or near the junction surface, a predetermined etching process for the p-type semiconductor layer on the etching-stop semiconductor layer is not continuously performed for the i-type semiconductor layer under the etching-stop semiconductor layer because the etching-stop semiconductor layer has an etching selectivity different from that of the p-type semiconductor layer. For this reason, the boundary surface between the first and second mesas is set with high reproducibility to almost match the junction surface between the p-type semiconductor layer and the i-type semiconductor layer. Therefore, a pin-type light receiving device which realizes reduction of the dark current with high reliability can be obtained.

In addition, according to a optoelectronic integrated circuit of the present invention, since a pin-type light receiving device according to the present invention and an electronic circuit device are monolithically integrated, a dark current generated in the pin-type light receiving device is reduced, and noise generated in the electronic circuit device is reduced. Therefore, a optoelectronic integrated circuit whose receiving sensitivity is improved by reduction of the noise can be obtained.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A pin-type light receiving device comprising:
    a semiconductor substrate;
    an n-type semiconductor layer formed over a portion of the semiconductor substrate, the n-type semiconductor layer having a bottom surface and a top surface which is opposite to the bottom surface;
    a first i-type semiconductor layer formed over a portion of the top surface of the n-type semiconductor layer, the first i-type semiconductor layer having a bottom surface, a top surface which is opposite the bottom surface, and side surfaces between the top surface and the bottom surface, and;
    a first p-type semiconductor layer formed over a portion of the top surface of the first i-type semiconductor layer, the first p-type semiconductor layer having a bottom surface, a top surface which is opposite the bottom surface, and side surfaces between the top surface and the bottom surface, the side surfaces of the first p-type semiconductor layer proximal the bottom surface of the first p-type semiconductor layer defining a perimeter which is spaced at a substantial distance from a perimeter defined by the side surfaces of the first k-type semiconductor layer proximal the top surface of the first i-type semiconductor layer; and
    an etching stop semiconductor layer provided between the first p-type semiconductor layer and the first i-type semiconductor layer, the etching stop semiconductor layer having a wider energy band gap than the first p-type semiconductor layer and entirely covering the top surface of the first i-type semiconductor layer.

2. A device according to claim 1, wherein the first i-type semiconductor layer is made of GaInAs.

3. A device according to claim 1, wherein the first p-type semiconductor layer is made of one of GaInAs and GaInAsP, and wherein the etching stop semiconductor layer is made of InP.

4. A device according to claim 1, wherein the first p-type semiconductor layer is made of one of GaInAs and GaInAsP, and wherein the etching stop semiconductor layer is made of GaInAsP having an energy band gap wider than that of the first p-type semiconductor layer.

5. A device according to claim 1, further including:
    a transistor provided between the semiconductor substrate and the n-type semiconductor layer, the transistor including:
    buffer layer formed over the semiconductor layer;
    a channel layer formed over the buffer layer; and
    an electron supply layer formed over the channel layer.

6. A device according to claim 1, further including:
    a second i-type semiconductor layer provided between the first p-type semiconductor layer and the etching stop semiconductor layer, the second i-type semiconductor layer having a narrower energy band gap than the etching stop semiconductor layer and entirely covering the bottom surface of the first p-type semiconductor layer.

7. A device according to claim 6, wherein the second i-type semiconductor layer is made of one of GaInAs and GaInAsP, and wherein the etching stop semiconductor layer is made of InP.

8. A device according to claim 6, wherein the second i-type semiconductor layer is made of one of GaInAs and GaInAsP, and wherein the etching stop semiconductor layer is made of GaInAsP having an energy band gap wider than that of the second i-type semiconductor layer.

9. An optoelectronic integrated circuit comprising;
    a pin-type light receiving device according to claim 1; and
    an electronic circuit device provided over the semiconductor substrate, the electronic circuit device being electrically connected to the pin-type light receiving device and being monolithically formed over the semiconductor substrate,
    wherein the pin-type light receiving device and the electronic circuit device are integrated.

10. A circuit according to claim 9, wherein the electronic circuit device is a field effect transistor.

11. A circuit according to claim 9, wherein the electronic circuit device is a bipolar transistor.

12. A circuit according to claim 9, wherein the first p-type semiconductor layer is made of one of GaInAs and GaInAsP, and wherein the etching stop semiconductor layer is made of InP.

13. A circuit according to claim 9, wherein the first p-type semiconductor layer is made of one of GaInAs and GaInAsP, and wherein the etching stop semiconductor layer is made of GaInAsP having an energy band gap wider than that of the first p-type semiconductor layer.

14. A circuit according to claim 9, wherein the pin-type light receiving device further includes:
a transistor provided between the semiconductor substrate and the n-type semiconductor layer, the transistor having
a buffer layer formed over the semiconductor layer;
a channel layer formed over the buffer layer; and
an electron supply layer formed over the channel layer.

15. A circuit according to claim 9, wherein the pin-type light receive device further includes:
an etching stop semiconductor layer provided between the first p-type semiconductor layer and the first i-type semiconductor layer, the etching stop semiconductor layer having a wider energy band gap than the first p-type semiconductor layer and entirely covering the top surface of the first i-type semiconductor layer.

16. A circuit according to claim 15, wherein the pin-type light receiving device further includes:
a second p-type semiconductor layer provided between the etching stop semiconductor layer and the first i-type semiconductor layer, the second p-type semiconductor layer entirely covering the top surface of the first i-type semiconductor layer.

17. A circuit according to claim 15, wherein the pin-type light receiving device further includes:
a second i-type semiconductor layer provided between the first p-type semiconductor layer and the etching stop semiconductor layer, the second i-type semiconductor layer having a narrower energy band gap than the etching stop semiconductor layer and entirely covering the bottom surface of the first p-type semiconductor layer.

18. A circuit according to claim 17, wherein the second i-type semiconductor layer is made of one of GaInAs and GaInAsP, and wherein the etching stop semiconductor layer is made of InP.

19. A circuit according to claim 17, wherein the second i-type semiconductor layer is made of one of GaInAs and GaInAsP, and wherein the etching stop semiconductor layer is made of GaInAsP having an energy band gap wider than that of the second i-type semiconductor layer.

20. A device according to claim 1, further including:
a second p-type semiconductor layer provided between the etching stop semiconductor layer and the first, i-type semiconductor layer, the second p-type semiconductor layer entirely covering the top surface of the first i-type semiconductor layer.

21. A pin-type light receiving device comprising:
a semiconductor substrate;
an n-type semiconductor layer formed over a portion of the semiconductor substrate, the n-type semiconductor layer having a bottom surface and a top surface which is opposite the bottom surface;
a first electrode formed over a portion of the top surface of the n-type semiconductor layer;
an i-type semiconductor layer formed over a portion of the top surface of the n-type semiconductor layer, the i-type semiconductor layer having a bottom surface, a top surface which is opposite the bottom surface, and side surfaces between the top surface and the bottom surface, the i-type semiconductor layer also having a step portion where side surfaces of a portion of the i-type semiconductor layer above the step portion define a perimeter which is displaced a substantial distance from a perimeter defined by side surfaces of a portion of the i-type semiconductor layer below the step portion;
a p-type semiconductor layer formed over a portion of the top surface of the i-type semiconductor layer, the p-type semiconductor layer having a bottom surface and a top surface which is opposite to the bottom surface; and
a second electrode formed over a portion of the top surface of the p-type semiconductor layer.

22. A device according to claim 21, further including:
a first electrode formed over a portion of the top surface of the n-type semiconductor layer; and
a second electrode formed over a portion of the top surface of the p-type semiconductor layer.

23. A device according to claim 21, further including:
a transistor provided between the semiconductor substrate and the n-type semiconductor layer, the transistor having
a buffer layer formed over the semiconductor layer;
a channel layer formed over the buffer layer; and
an electron supply layer formed over the channel layer.

24. A device according to claim 21, wherein the i-type semiconductor layer is made of GaInAs.

25. A device according to claim 21, wherein the p-type semiconductor layer is made of one of GaInAs and GaInAsP.

26. An optoelectronic integrated circuit comprising;
a pin-type light receiving device according to claim 21; and
an electronic circuit device provided over the semiconductor substrate, the electronic circuit device being electrically connected to the pin-type light receiving device and being monolithically formed over the semiconductor substrate,
wherein the pin-type light receiving device and the electronic circuit device are integrated.

27. A circuit according to claim 26, wherein the pin-type light receiving device further includes:
a transistor provided between the semiconductor substrate and said n-type semiconductor layer, the transistor having
a buffer layer formed over the semiconductor layer;
a channel layer formed over the buffer layer; and
an electron supply layer formed over the channel layer.

28. A circuit according to claim 26, wherein the i-type semiconductor layer of the pin-type light receiving device is made of GaInAs.

29. A circuit according to claim 26, wherein the p-type semiconductor layer of the pin-type light receiving device is made of one of GaInAs and GaInAsP.

30. A circuit according to claim 26, wherein the electronic circuit device is a field effect transistor.

31. A circuit according to claim 26, wherein the electronic circuit device is a bipolar transistor.

32. A pin-type light receiving device comprising:
a semiconductor substrate;
an n-type semiconductor layer formed over a portion of the semiconductor substrate, the n-type semiconductor layer having a bottom surface and a top surface which is opposite the bottom surface;
a first electrode formed over a portion of the top surface of the n-type semiconductor layer;

an i-type semiconductor layer formed overt a portion of the top surface of the n-type semiconductor layer, the i-type semiconductor layer having a bottom surface and a top surface which is opposite the bottom surface;

a p-type semiconductor layer formed over a portion of the top surface of the i-type semiconductor layer, the p-type semiconductor layer having a bottom surface, a top surface which is opposite the bottom surface, and side surfaces between the top surface and the bottom surface, the p-type semiconductor layer also having a step portion where side surfaces of a portion of the p-type semiconductor layer above the step portion define a perimeter which is displaced a substantial distance from a perimeter defined by side surfaces of a portion of the p-type semiconductor layer below the step portion; and a second electrode formed over a portion of the top surface of the p-type semiconductor layer.

33. An optoelectronic integrated circuit comprising:

a pin-type light receiving device according to claim and an electronic circuit device provided over the semiconductor substrate, the electronic circuit device being electrically connected to the pin-type light receiving device and being monolithically formed over the semiconductor substrate, wherein the pin-type light receiving device and the electronic circuit device are integrated.

34. A circuit according to claim 33, wherein the pin-type light receiving device further includes:

a transistor provided between the semiconductor substrate and a n-type semiconductor layer, the transistor having a buffer layer formed over the semiconductor layer;
a channel layer formed over the buffer layer; and
an electron supply layer formed over the channel layer.

35. A circuit according to claim 33, wherein the i-type semiconductor layer of the pin-type light receiving device is made of GaInAs.

36. A circuit according to claim 33, wherein the p-type semiconductor layer of the pin-type light receiving device is made of one of GaInAs and GaInAsP.

37. A circuit according to claim 33, wherein the electronic circuit device is a field effect transistor.

38. A circuit according to claim 33, wherein the electronic circuit device is a bipolar transistor.

39. A device according to claim 32, further including:

a first electrode formed over a portion ρf the top surface of the n-type semiconductor layer; and a second electrode formed over a portion of the top surface of the p-type semiconductor layer.

40. A device according to claim 32, further including:

a transistor provided between the semiconductor substrate and the n-type semiconductor layer, the transistor having a buffer layer formed over the semiconductor layer;
a channel layer formed over the buffer layer; and
an electron supply layer formed over the channel layer.

41. A device according to claim 32, wherein the i-type semiconductor layer is made of GaInAs.

42. A device according to claim 32, wherein the p-type semiconductor layer is made of one of GaInAs and GaInAsP.

* * * * *